(12) United States Patent
Kikumoto et al.

(10) Patent No.: US 11,581,208 B2
(45) Date of Patent: Feb. 14, 2023

(54) SUBSTRATE TREATING APPARATUS

(71) Applicant: SCREEN Holdings Co., Ltd., Kyoto (JP)

(72) Inventors: Noriyuki Kikumoto, Kyoto (JP); Yuzo Uchida, Kyoto (JP); Hiroyuki Kawahara, Kyoto (JP)

(73) Assignee: SCREEN Holdings Co., Ltd.

( * ) Notice: Subject to any disclaimer, the term of this patent is extended or adjusted under 35 U.S.C. 154(b) by 342 days.

(21) Appl. No.: 17/016,442

(22) Filed: Sep. 10, 2020

(65) Prior Publication Data
US 2021/0082720 A1 Mar. 18, 2021

(30) Foreign Application Priority Data

Sep. 13, 2019 (JP) .............................. JP2019-167040

(51) Int. Cl.
| | | |
|---|---|---|
| *H01L 21/67* | (2006.01) | |
| *H01L 21/673* | (2006.01) | |
| *B08B 3/04* | (2006.01) | |
| *H01L 21/687* | (2006.01) | |
| *H01L 21/677* | (2006.01) | |

(52) U.S. Cl.
CPC .......... *H01L 21/6732* (2013.01); *B08B 3/041* (2013.01); *H01L 21/67051* (2013.01); *H01L 21/67742* (2013.01); *H01L 21/68707* (2013.01)

(58) Field of Classification Search
CPC .................................................. H01L 21/6732
See application file for complete search history.

(56) References Cited

U.S. PATENT DOCUMENTS

| | | | |
|---|---|---|---|
| 2014/0093337 A1 | 4/2014 | Hayashi et al. | ......... 414/225.01 |
| 2015/0132085 A1 | 5/2015 | Saito et al. | |

FOREIGN PATENT DOCUMENTS

| | | |
|---|---|---|
| JP | 2000-135475 A | 5/2000 |
| JP | 2014-072490 A | 4/2014 |
| JP | 2015-95639 A | 5/2015 |
| JP | 2016-201526 A | 12/2016 |

OTHER PUBLICATIONS

Office Action dated Oct. 27, 2021 for corresponding Korean Patent Application No. 10-2020-0116075.

*Primary Examiner* — Jason Y Ko
(74) *Attorney, Agent, or Firm* — Ostrolenk Faber LLP

(57) ABSTRACT

Disclosed is a substrate treating apparatus that performs a cleaning treatment on substrates. A treating block includes a plurality of treating units in an upper and lower stages, respectively. The treating block includes a front face cleaning unit and a back face cleaning unit, each being at least one in number, in the upper stage. The treating block includes at least one tower unit including the front face cleaning unit and the back face cleaning unit, each being at least one in number, in the lower stage. Moreover, a transportation block is provided that includes a center robot in each of the upper and lower stages.

20 Claims, 16 Drawing Sheets

Fig.5
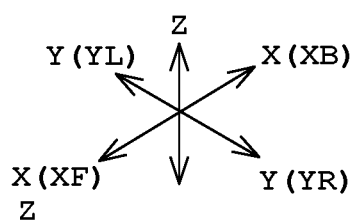
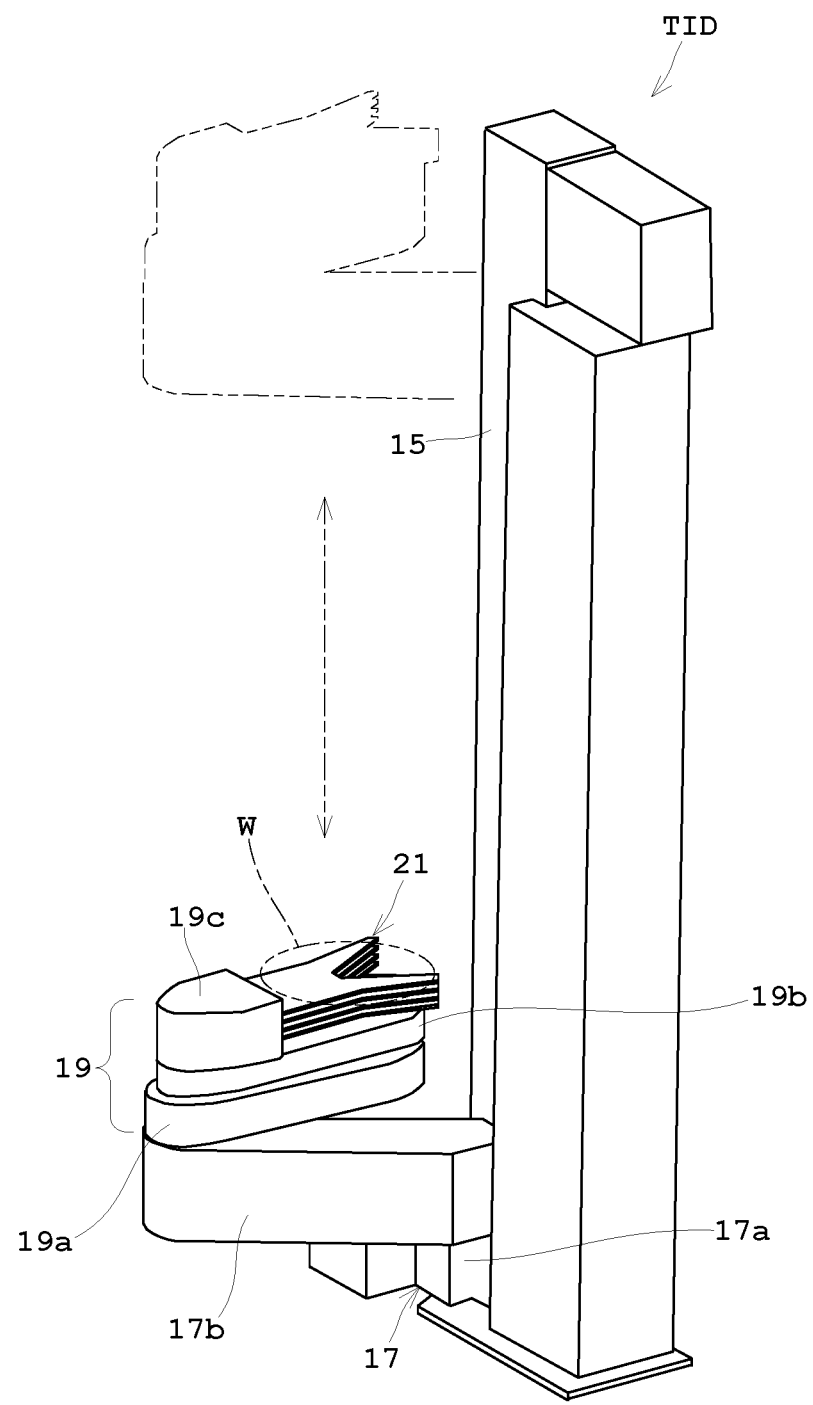

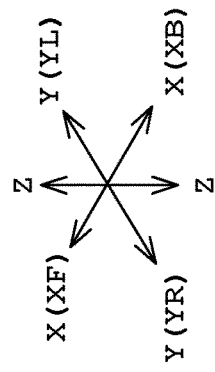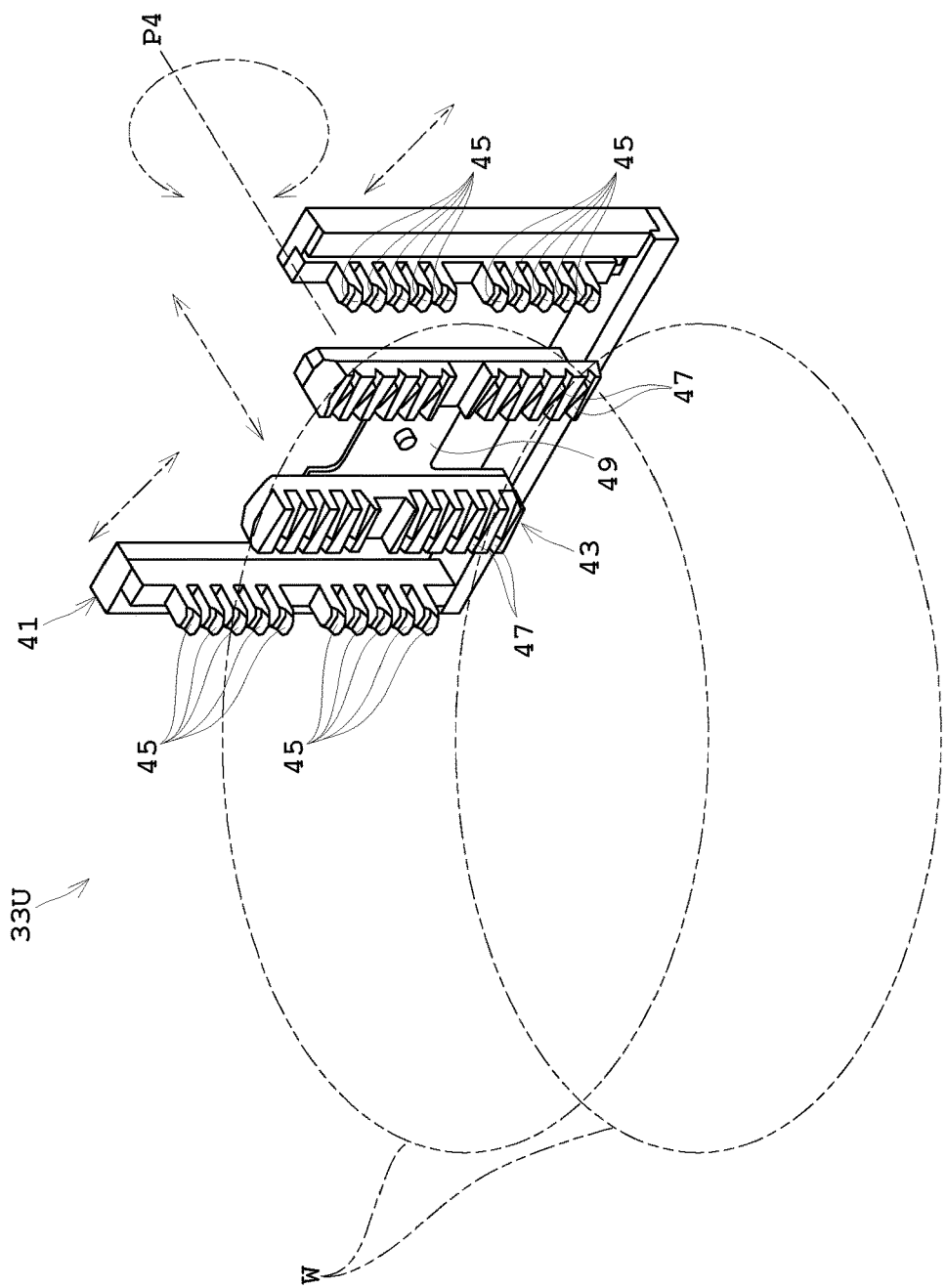
Fig. 9

SUBSTRATE TREATING APPARATUS

BACKGROUND OF THE INVENTION

Field of the Invention

The present invention relates to a substrate treating apparatus for performing a cleaning treatment, such as front face cleaning or a back face cleaning, on a substrate, such as a semiconductor wafer, a substrate for a liquid crystal display or for an organic electroluminescence (EL) display, a glass substrate for photomask, an optical disk substrate, a magnetic disk substrate, a ceramic substrate, a substrate for a solar cell, or the like (hereinafter, simply referred to as substrate).

Background Art

Examples of currently-used devices of this type includes one including an indexer block, a treating block, and a reversing path block. See, for example, Japanese Unexamined Patent Application Publication No. 2014-72490 (FIG. 2).

The indexer block includes a carrier platform and an indexer robot. The treating block includes a front face cleaning unit and a back face cleaning unit as a processing unit. Carriers are placed on the carrier platform, respectively, in which a plurality of substrates are accommodated. The indexer robot transports the substrates individually between the carriers and the reversing path block. The reversing path block includes a reversing path unit. The reversing path unit includes a plurality of shelves on which the substrates are placed, and are configured to deliver the substrates to and from the treating block and configured to reverse faces of the substrates.

The treating block includes two back face cleaning units when seen leftward from the indexer block. The treating block includes two front face cleaning units on the two back face cleaning units. That is, the treating block includes a first treating line with four-layered structure when seen leftward from the indexer block. The treating block includes two back face cleaning units when seen rightward from the indexer block. The treating block includes two front face cleaning units on the two back face cleaning units. That is, the treating block includes a second treating line with four-layered structure when seen rightward from the indexer block. The treating block includes one main robot configured to transport a substrate among the front face cleaning units, the back face cleaning units, and the reversing path unit.

In such a device, only one main robot is disposed in the treating block. In contrast to this, the following configuration may be employed to enhance throughput in these days. Specifically, one main robot is provided in a two-layered treating unit in an upper stage of the treating block. Moreover, one main robot is provided in a two-layered treating unit in a lower stage of the treating block. In other words, two main robots are installed in the treating block. See, for example, Japanese Unexamined Patent Application Publication No. 2016-201526 (FIG. 10).

SUMMARY OF THE INVENTION

However, the conventional example with such a configuration as above possesses the following drawback.

Specifically, in the currently-used apparatus, if either the upper or lower main robot breaks down or all the upper and lower treating units break down, only either front face cleaning or back face cleaning can be performed. Accordingly, such a problem arises that the currently-used apparatus cannot perform any cleaning treatment over the both faces under the breakdown described above.

The present invention has been made regarding the state of the art noted above, and its object is to provide a substrate treating apparatus that allows enhanced throughput as well as front-back face cleaning treatment even when either a structure of an upper stage or a structure of a lower stage breaks down.

Solution to Problem

The present invention is constituted as stated below to achieve the above object.

One aspect of the present invention provides a substrate treating apparatus that performs a cleaning treatment on a substrate. The apparatus includes: an indexer block including a carrier platform on which a carrier capable of accommodating a plurality of substrates is placed, and an indexer robot configured to transport a substrate to and from the carrier disposed on the carrier platform, a treating block including a front face cleaning unit and a back face cleaning unit as treating units, the front face cleaning unit configured to perform a front face cleaning treatment on a substrate and the back face cleaning unit configured to perform a back face cleaning treatment on a substrate, and a reversing path block disposed between the indexer block and the treating block, including a plurality of shelves on which the substrates are placed, and having a reversing function of reversing faces of the substrates. The treating block includes at least one tower unit including a plurality of the treating units in an upper stage and a lower stage thereof respectively, the tower unit including the front face cleaning unit and the back face cleaning unit each provided by at least one in number in the upper stage and the front face cleaning unit and the back face cleaning unit each provided by at least one in number in the lower stage. The substrate treating apparatus further includes a transportation block including a center robot provided in each of the upper stage and the lower stage, and configured to transport a substrate between each of the treating units in the tower unit and the reversing path block.

With the aspect of the present invention, the treating block includes at least one tower unit. The tower unit includes a plurality of treating units in the upper and lower stages respectively. The tower unit includes the front face cleaning unit and the back face cleaning unit, each being at least one in number, in the upper stage. The tower unit includes the front face cleaning unit and the back face cleaning unit, each being at least one in number, in the lower stage. Moreover, the transportation block includes the center robot in each of the upper and lower stages in the treating block. This achieves enhanced throughput. With such a configuration, even if the center robot in either the upper stage or the lower stage breaks down or all the treating units in either the upper stage or lower stage break down, the other of the upper stage or the lower stage can perform a front-back face cleaning treatment. Accordingly, the front-back face cleaning treatment can be performed with a configuration that achieves enhanced throughput even when either the structure of the upper stage or the structure of the lower layer breaks down.

Moreover, it is preferred in the aspect of the present invention that the reversing path block includes at least two separated reversing path units in each of the upper stage and the lower stage thereof, and that the reversing path units each include a plurality of shelves where substrates are placed and each have a reversing function of reversing the faces of the substrates.

The reversing path block includes at least two separated reversing path units in each of the upper stage and the lower stage thereof. Accordingly, operation of only delivering a substrate without reversing the substrate for the front face cleaning treatment and operation of reversing the substrate for the back face cleaning can be performed in parallel in each of the stages. This achieves efficient operation of the front-back face cleaning treatment in the upper and lower stages.

Moreover, it is preferred in the aspect of the present invention that the treating block includes a plurality of the tower units, and that one of the tower units adjacent to the reversing path block includes more front face cleaning units than another of the tower units apart from the reversing path block.

Typically, the front face cleaning treatment is performed more frequently than the back face cleaning treatment. Accordingly, since the tower unit adjacent to the reversing path block includes more front face cleaning units, leading to reduction in transportation time by the center robots. This achieves efficient operation of the front face cleaning treatment.

Moreover, it is preferred in the aspect of the present invention that the tower units each include the front face cleaning unit and the back face cleaning unit across the center robot at a position same in level.

The center robot can prevent vertical movement while the substrate is transported between the front face cleaning unit and the back face cleaning unit via the reversing path unit, leading to an enhanced transportation efficiency of the substrate.

Moreover, it is preferred in the aspect of the present invention that the one of the tower units adjacent to the reversing path block includes at least one pair of the front face treating unit and the back face treating unit adjacent to each other in an up-down direction.

The one of the tower units adjacent to the reversing path block includes the front face treating unit and the back face treating unit adjacent to each other in the up-down direction. Accordingly, the center robot can move in a front-back direction by a shortened distance in the front-back face cleaning treatment. This achieves efficient transportation of the substrate.

Moreover, it is preferred in the aspect of the present invention that the upper stage and the lower stage of the one of the tower units adjacent to the reversing path block include the front face cleaning units across a boundary between the upper stage and the lower stage.

Typically, the front face cleaning treatment is performed more frequently than the back face cleaning treatment. Accordingly, arranging the front face cleaning units across the boundary between the upper layer and the lower layer achieves a reduction in distance of the vertical movement of the indexer robots in the front face cleaning treatment with use of both the upper and lower stages. This achieves an enhanced operational efficiency in the front face cleaning treatment.

Moreover, it is preferred in the aspect of the present invention that the upper stage and the lower stage of the one of the tower units adjacent to the reversing path block includes the back face cleaning units across a boundary between the upper stage and the lower stage.

Since the back face cleaning units are provided across the boundary between the upper stage and the lower stage, a reduction in distance of the vertical movement of the indexer robots is achieved in the back face cleaning treatment more frequently. This achieves an enhanced operational efficiency in the back face cleaning treatment.

Moreover, it is preferred in the aspect of the present invention that the tower units each include a plurality of treating units in the upper stage thereof and a plurality of treating units in the lower stage thereof in equal arrangement.

Even if one of the treating units in either the upper stage or the lower stage breaks down, the treating units in the other stage can perform treatment continuously through the same transportation path in the up-down direction. Consequently, such a treatment so as not to change throughput is performable even when the treating units in the other stage perform treatment.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 5 is an overall perspective view of an indexer robot.

FIG. 6A illustrates four hand bodies, and FIG. 6B illustrates two hand bodies.

FIG. 9 is a perspective view of a principal part of a reversing path unit.

DESCRIPTION OF EMBODIMENTS

The following describes one embodiment of the present invention with reference to the drawings.

Figure 1:
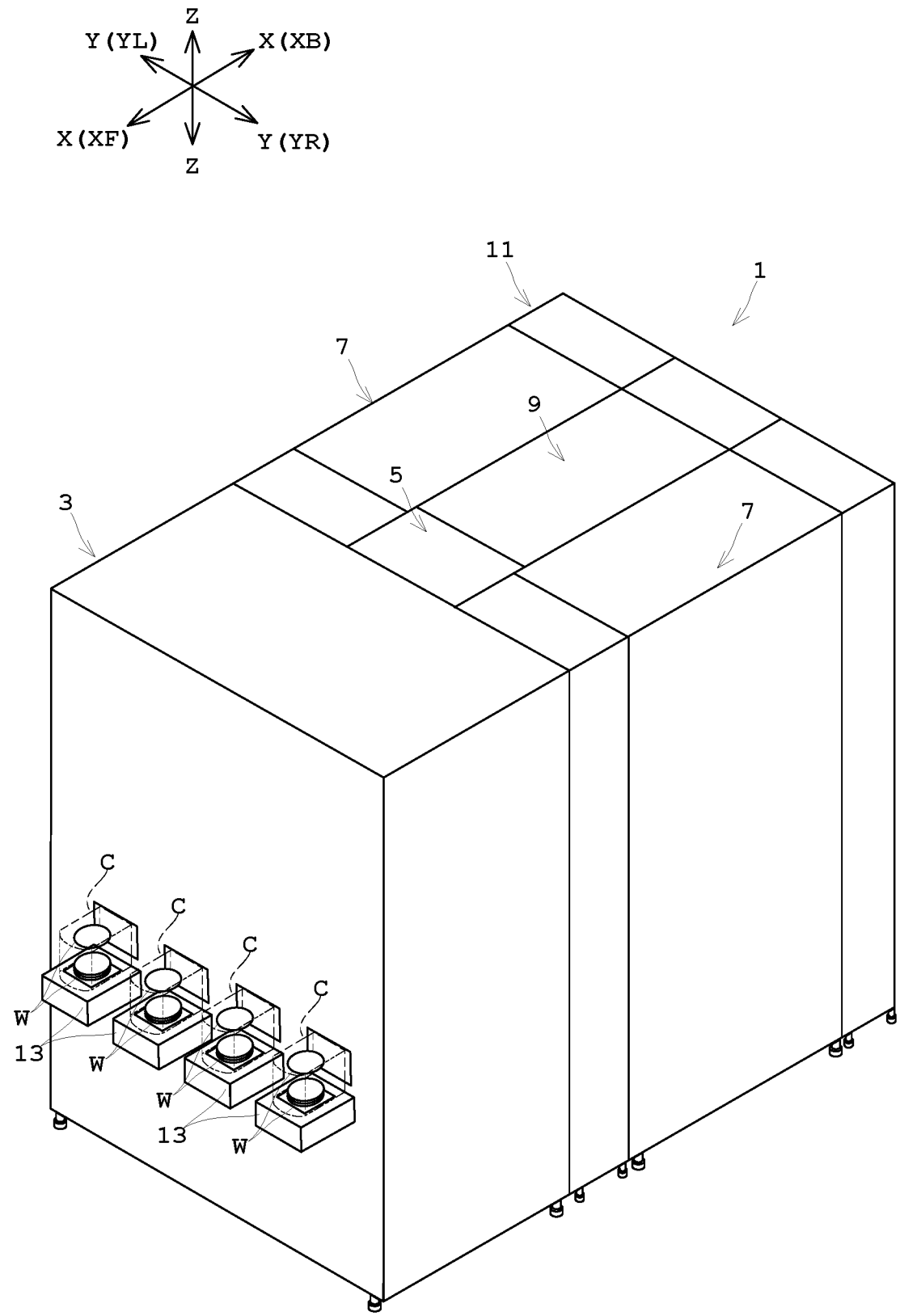
FIG. 1 is a perspective view of an overall configuration of a substrate treating apparatus according to one embodiment of the present invention.
Figure 2:
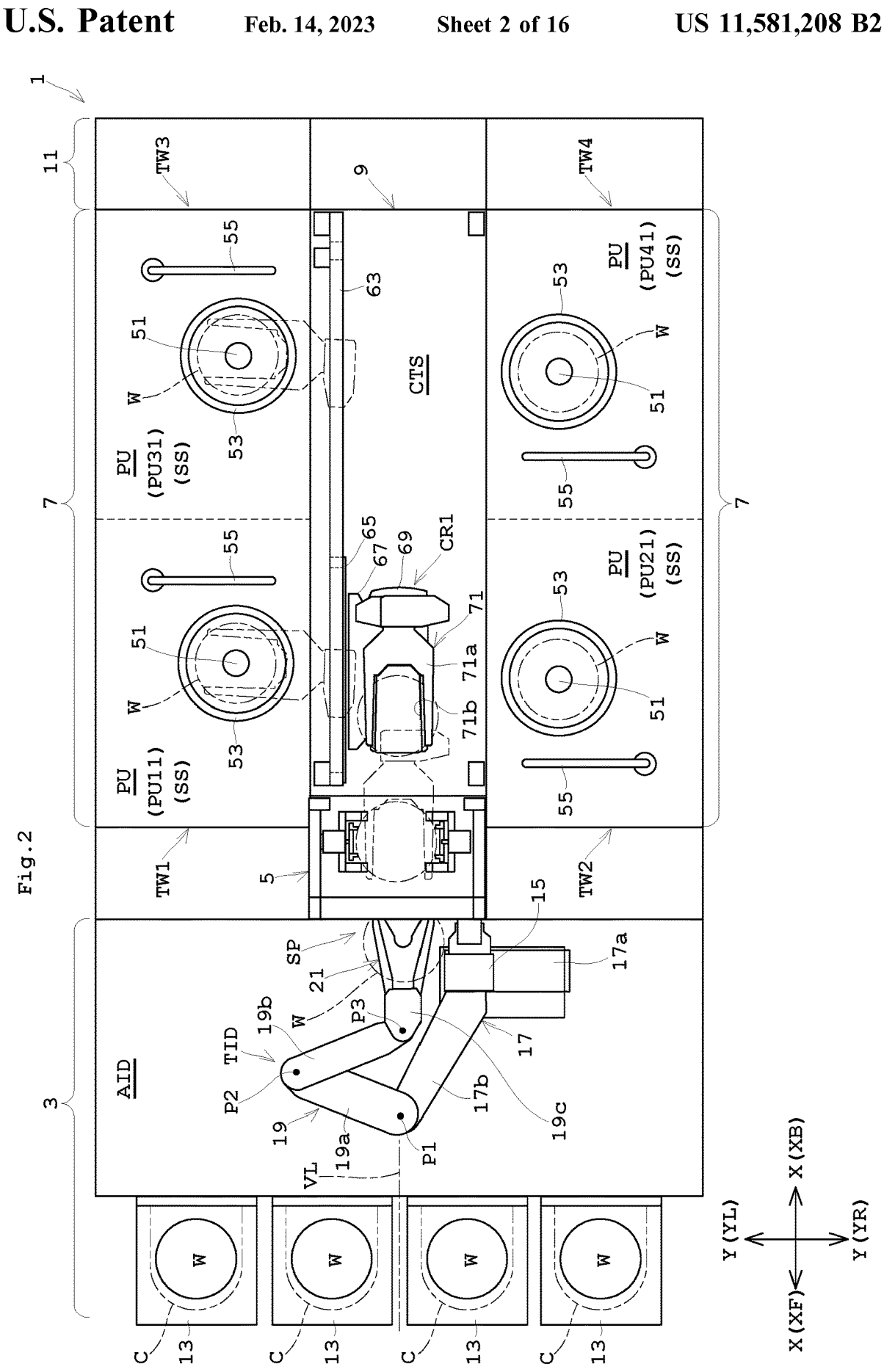
FIG. 2 is a plan view of the substrate treating apparatus illustrating an upper layer of an upper stage of a treating block.
Figure 3:
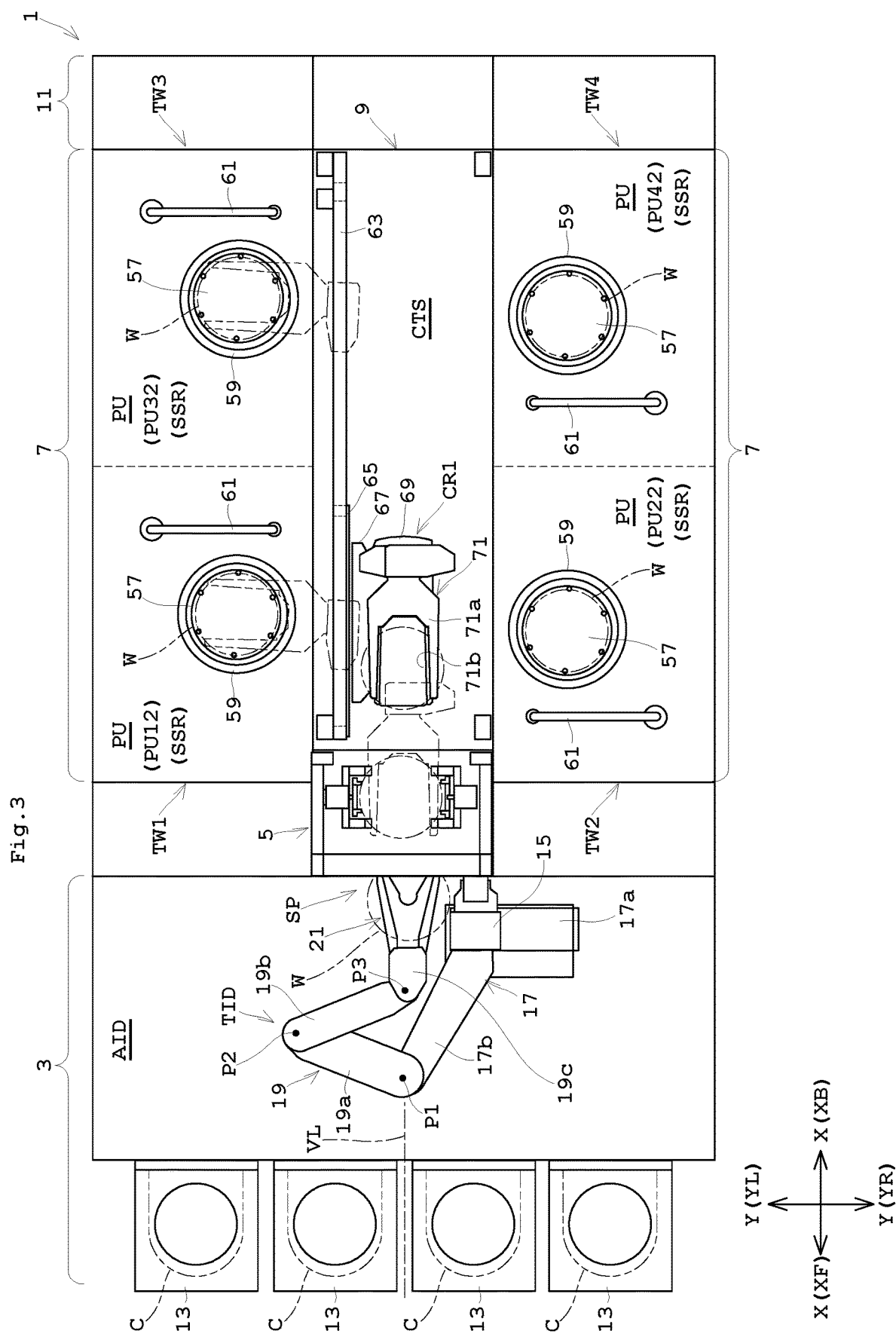
FIG. 3 is a plan view of the substrate treating apparatus illustrating a lower layer of the upper stage of the treating block.
Figure 4:
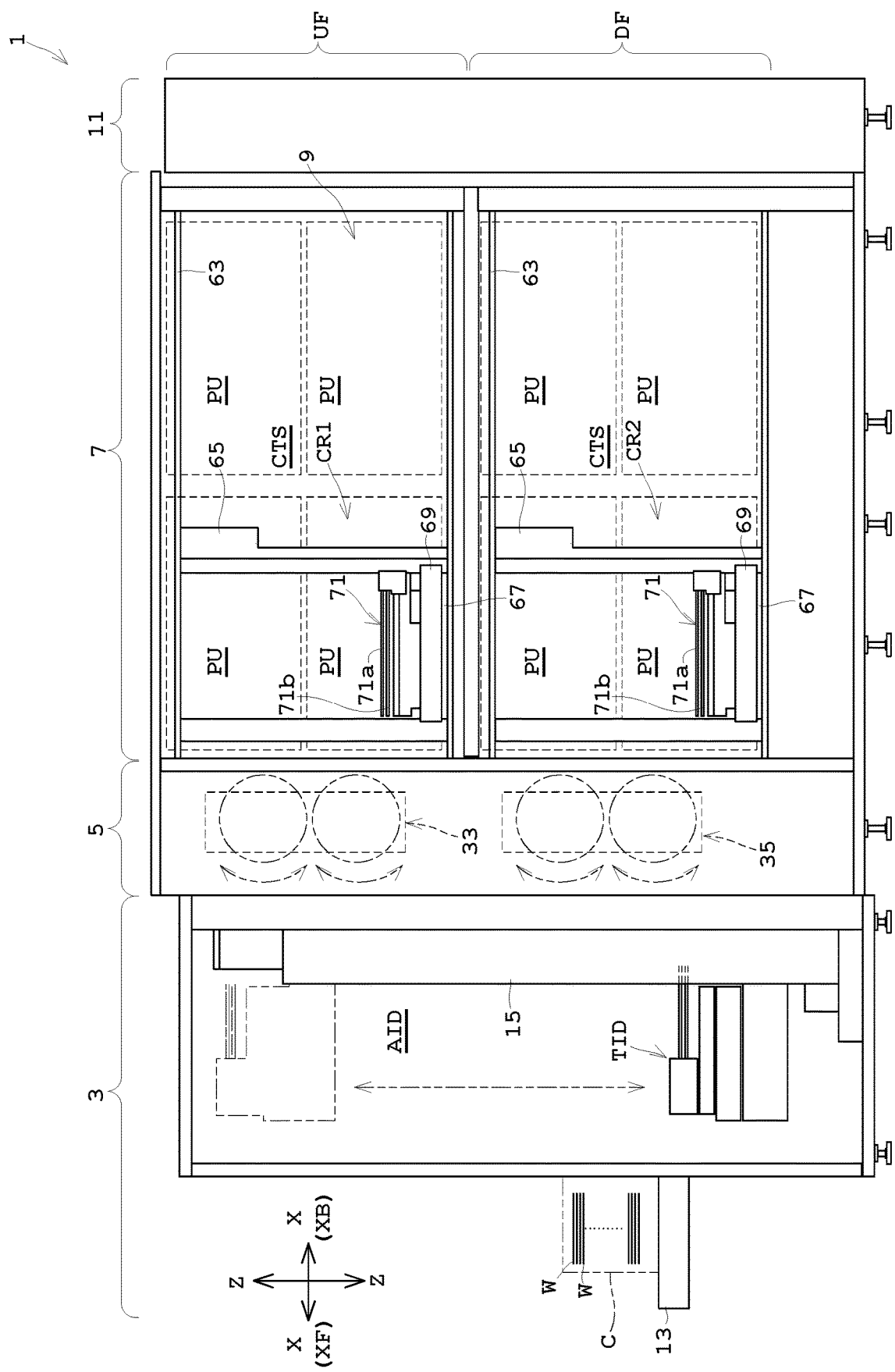
FIG. 4 is a side view of the substrate treating apparatus.

FIG. 1 is a perspective view of an overall configuration of a substrate treating apparatus according to one embodiment of the present invention. FIG. 2 is a plan view of the substrate treating apparatus illustrating an upper layer of an upper stage of a treating block. FIG. 3 is a plan view of the substrate treating apparatus illustrating a lower layer of the upper stage of the treating block. FIG. 4 is a side view of the substrate treating apparatus.

A substrate treating apparatus 1 according to one embodiment of the present invention enables a front face cleaning treatment for cleaning a front face of a substrate W and a back face cleaning treatment for cleaning a back face of the substrate. The substrate treating apparatus 1 includes an indexer block 3, a reversing path block 5, treating blocks 7, a transportation block 9, and a utility block 11.

The indexer block 3 delivers the substrate W, as a treatment target, to and from the reversing path block 5. The reversing path block 5 is disposed between the indexer block 3 and the treating blocks 7. The reversing path block 5 delivers the substrate W directly to and from the indexer block 3 and the transportation block 9 without reversing the substrate W. Moreover, the reversing path block 5 delivers the substrate W to and from the transportation block 9 while reversing the substrate W. The transportation block 9 transports the substrate W between the reversing path block 5 and the treating block 7. The treating block 7 includes front face cleaning units SS for cleaning a front face of the substrate W and back face cleaning units SSR for cleaning a back face of the substrate W. The utility block 11 includes a treatment liquid such as a chemical or deionized water, and gas such as a nitrogen gas or air to be supplied to the treating block 7.

The substrate treating apparatus 1 is configured such that the indexer block 3, the reversing path block 5, the treating blocks 7 and the transportation block 9, and the utility block 11 are arranged in this order.

In the following description, a direction where the indexer block 3, the reversing path block 5, the treating blocks 7 and the transportation block 9, and the utility block 11 are arranged is referred to as a "front-back direction X" (horizontal direction). Specifically, a direction from the utility block 11 to the indexer block 3 is referred to as "forward XF", whereas a direction opposite to the forward direction XF is referred to as "backward XB". A direction horizontally orthogonal with respect to the front-back direction X is referred to as a "width direction Y". Moreover, one side of the "width direction Y" is appropriately referred to as "right YR", whereas a side opposite to the "right direction YR" is referred to as "left YL" when seen from a front side of the indexer block 3. Moreover, a vertical direction is referred to as an "up-down direction Z" (a height direction, or a vertical direction). It should be noted that simple description such as "lateral" and "transverse" is not limited to any of the front-back direction X and the width direction Y.

The indexer block 3 includes carrier platforms 13, a transportation space AID, and an indexer robot TID. The substrate treating apparatus 1 of this embodiment includes four carrier platforms 13, for example. Specifically, four carrier platforms 13 are provided in the width direction Y. Carriers C are placed on the carrier platforms 13 individually. The carriers C each accommodate a plurality of (e.g., 25) substrates W in a stacked manner. The carrier platforms 13 deliver the carriers C individually to and from an overhead hoist transport (OHT) (also referred to as overhead travelling unmanned guided vehicle), not shown, for example. The OHT transports the carriers C with use of a ceiling of a clean room. Examples of the carriers C include a front opening unified pod (FOUP).

The transportation space AID is disposed in the backward direction XB of the carrier platforms 13. The transportation space AID includes the indexer robot TID provided therein. The indexer robot TID delivers the substrate W among the carriers C. Moreover, the indexer robot TID delivers the substrate W to and from the reversing path block 5. The transportation space AID includes only one indexer robot TID provided therein.

Reference is now made to FIG. 5. FIG. 5 is an overall perspective view of the indexer robot.

As shown in FIG. 5, the indexer robot TID includes a guide rail 15, a base 17, an articulated arm 19, an a hand 21. The guide rail 15 is disposed longitudinally in the up-down direction Z. A driving unit, not shown, causes the base 17 to move upward and downward through the guide rail 15. At this time, the guide rail 15 guides the base 17 in the up-down direction Z. The guide rail 15 is positioned so as to be fixed in the front-back direction X and the width direction Y. Specifically, the guide rail 15 is positioned so as not to overlap a position of the substrate W in the reversing path block 5 when seen in the width direction Y adjacent to the carrier platform 13 of the indexer block 3. In addition, the guide rail 15 is disposed adjacent to an inner wall of indexer block 3 adjacent to the reversing path block 5. Here, in plan view, a line connecting the center of the indexer block 3 in the width direction Y and the center of the reversing path block 5 in the width direction Y is defined as a virtual line VL (see FIGS. 2 and 3). The guide rail 15 and the base 17 are disposed laterally of the virtual line VL. In this embodiment, the guide rail 15 and the base 17 are shifted rightward YR. The base 17 is spaced apart from a rear face of the indexer block 3 by a space SP toward the carrier platform 13 in plan view. The space SP has a dimension sufficient to allow at least partial accommodation of the reversing path block 5.

The base 17 includes a base body 17a and a fixing arm 17b. The base body 17a is disposed on the guide rail 15 in a movable manner. The fixing arm 17b protrudes laterally from the base body 17a. The fixing arm 17b protrudes in a forward direction XF from the base body 17a in such a manner that its distal end is positioned at the center of the four carrier platforms 13 in the width direction Y. That is, the fixing arm 17b protrudes in the forward direction XF from the base body 17a in such a manner that its distal end is positioned on the virtual line VL. The articulated arm 19 is formed with a first arm 19a, a second arm 19b, and a third arm 19c. Here, it is assumed that the third arm 19c where the hand 21 is disposed is on a distal end side, and the first arm 19a is on a proximal end side. A proximal end of the first arm 19a as the proximal end side of the articulated arm 19 is attached to a proximal end side of the fixing arm 17b.

The articulated arm 19 is configured in such a manner that the first to third arms 19a, 19b, and 19c are rotatable around a rotary shaft P1, a rotary shaft P2, a rotary shaft P3, respectively. The rotary shaft P1 is a rotary shaft of the first arm 19a on the proximal end side. The rotary shaft P2 is a rotary shaft of the second arm 19b on the proximal end side. The rotary shaft P3 is a rotary shaft of the third arm 19b on the proximal end side. The articulated arm 19 is configured in such a manner that the hand 21 is movable freely in the front-back direction X and the width direction Y. The base 17 moves upward/downward along the guide rail 15. The hand 21 moves upward/downward along the guide rail 15 together with the base 17. As described above, the hand 21 is movable in the up-down direction Z. Moreover, the articulated arm 19 is disposed in such a manner that the rotary shaft P1 of the first arm 19a on the proximal end side is shifted toward the reversing path block 5 than the guide rail 15 in the width direction Y when seen from the carrier platforms 13. That is, the rotary shaft P1 is positioned on the virtual line VL. Moreover, the rotary shaft P1 is positioned leftward YL with respect to the base 17. The indexer robot TID is configured in such a manner as above and is accessible to the four carriers C and the reversing path block 5, mentioned later, with the articulated arm 19.

Figure 6A:
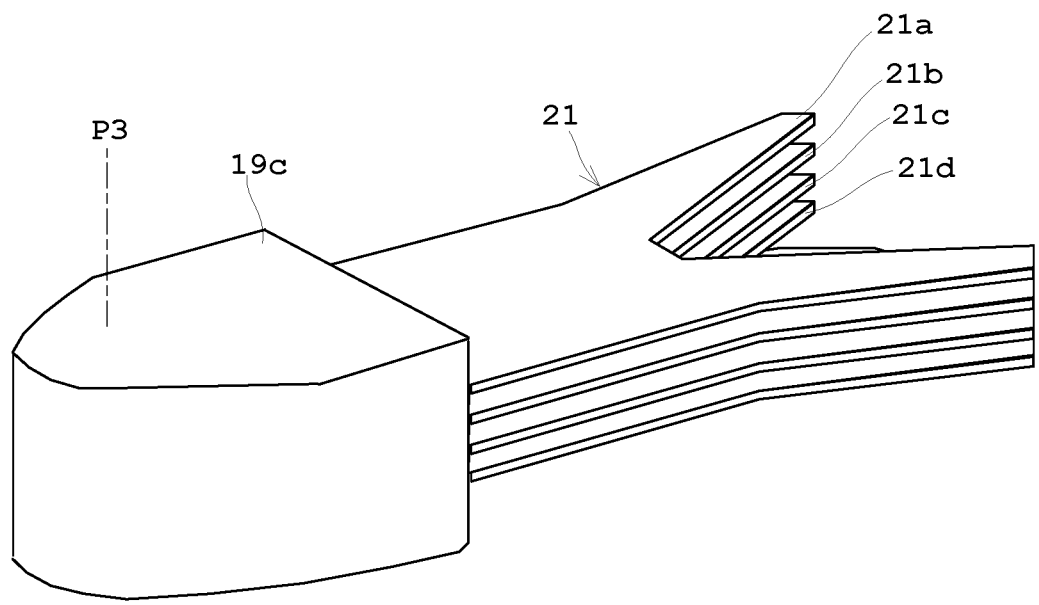
FIGS. 6A and 6B are perspective views of a hand of the indexer robot.
Figure 6B:
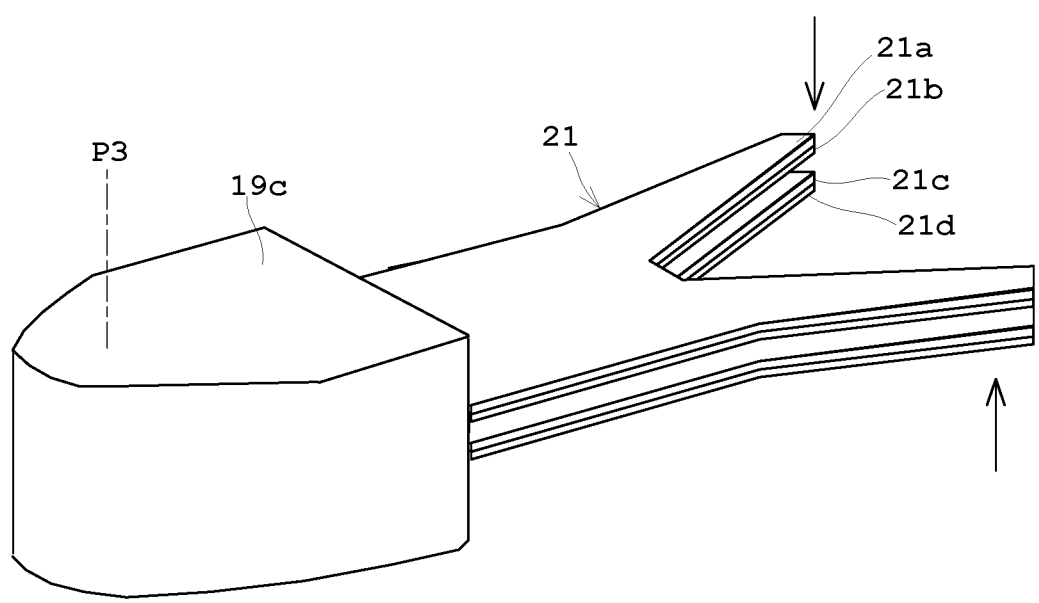

Reference is now made to FIGS. 6A and 6B. FIGS. 6A and 6B are perspective views of the hand of the indexer robot. FIG. 6A illustrates four hand bodies, and FIG. 6B illustrates two hand bodies.

The indexer robot TID described above includes the hand 21. As illustrated in FIG. 6A, the hand 21 includes a hand body 21a, a hand body 21b, a hand body 21c, and a hand body 21d in this order from above to below. The four hand bodies 21a to 21d of the hands 21 are attached to the third arm 19c. Among the four hand bodies 21a to 21d, the uppermost hand body 21a and the lowermost hand body 21d are movable in the up-down direction Z as illustrated in FIG. 6B. When substrates W are transported to and from a carrier C and when the carrier C accommodates 25 substrates W, for example, the indexer robot TID transports four substrates W at a time with the four hand bodies 21a to 21d. When one substrate W is left in the carrier C, the one substrate W is transported with an integrated hand body 21a and 21b formed by integrating the hand body 21a and the hand body 21b. Then, one substrate W accommodated in the next carrier C is transported with an integrated hand body 21c and 21d formed by integrating the hand body 21c and the hand body 21d. Accordingly, the indexer robot TID having the four hand bodies 21a to 21d achieves efficient transportation to and from the carriers C each accommodating 25 substrates W.

Figure 7:
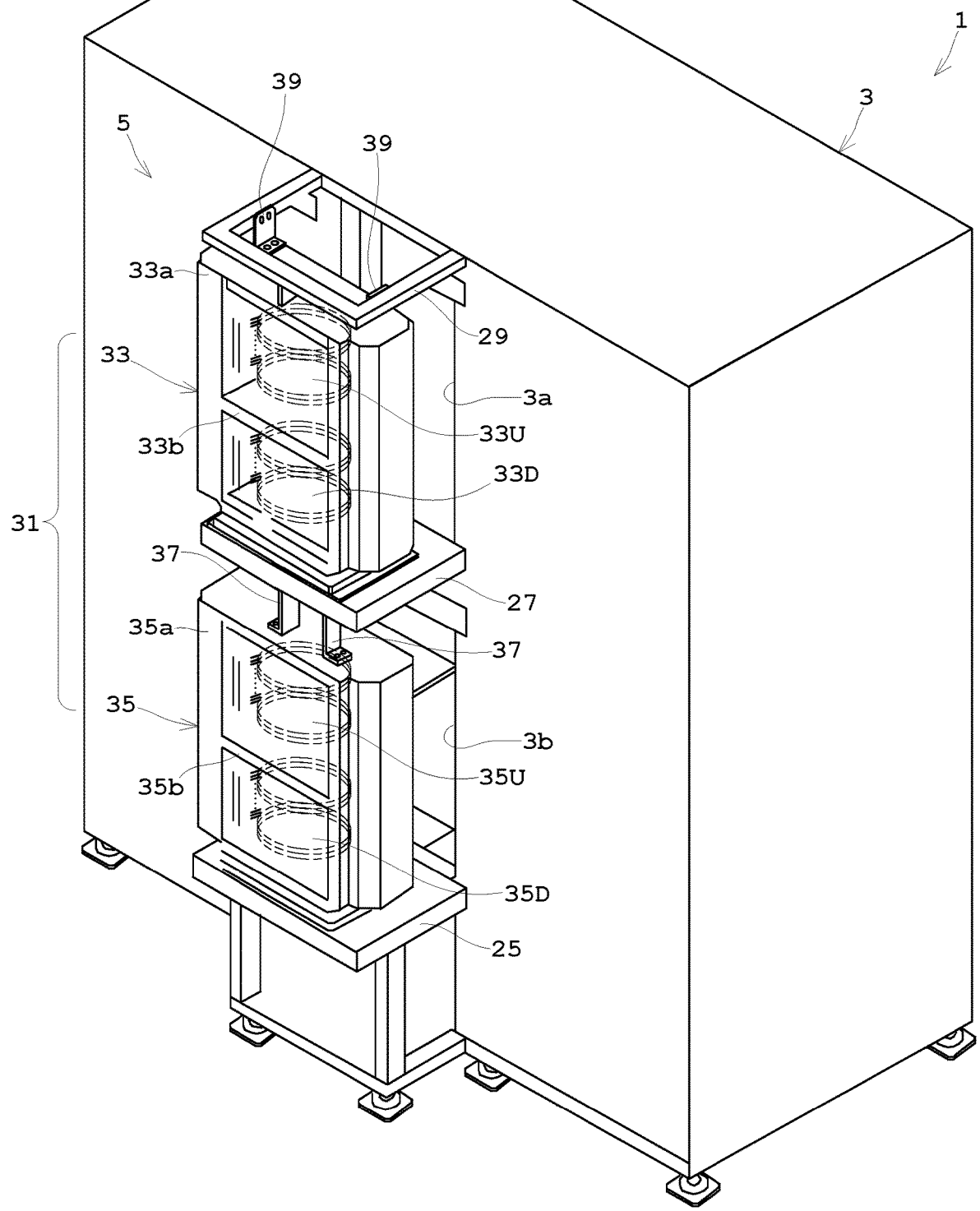
FIG. 7 is a perspective view of a reversing path block when the indexer block is seen from a rear face thereof.
Figure 8:
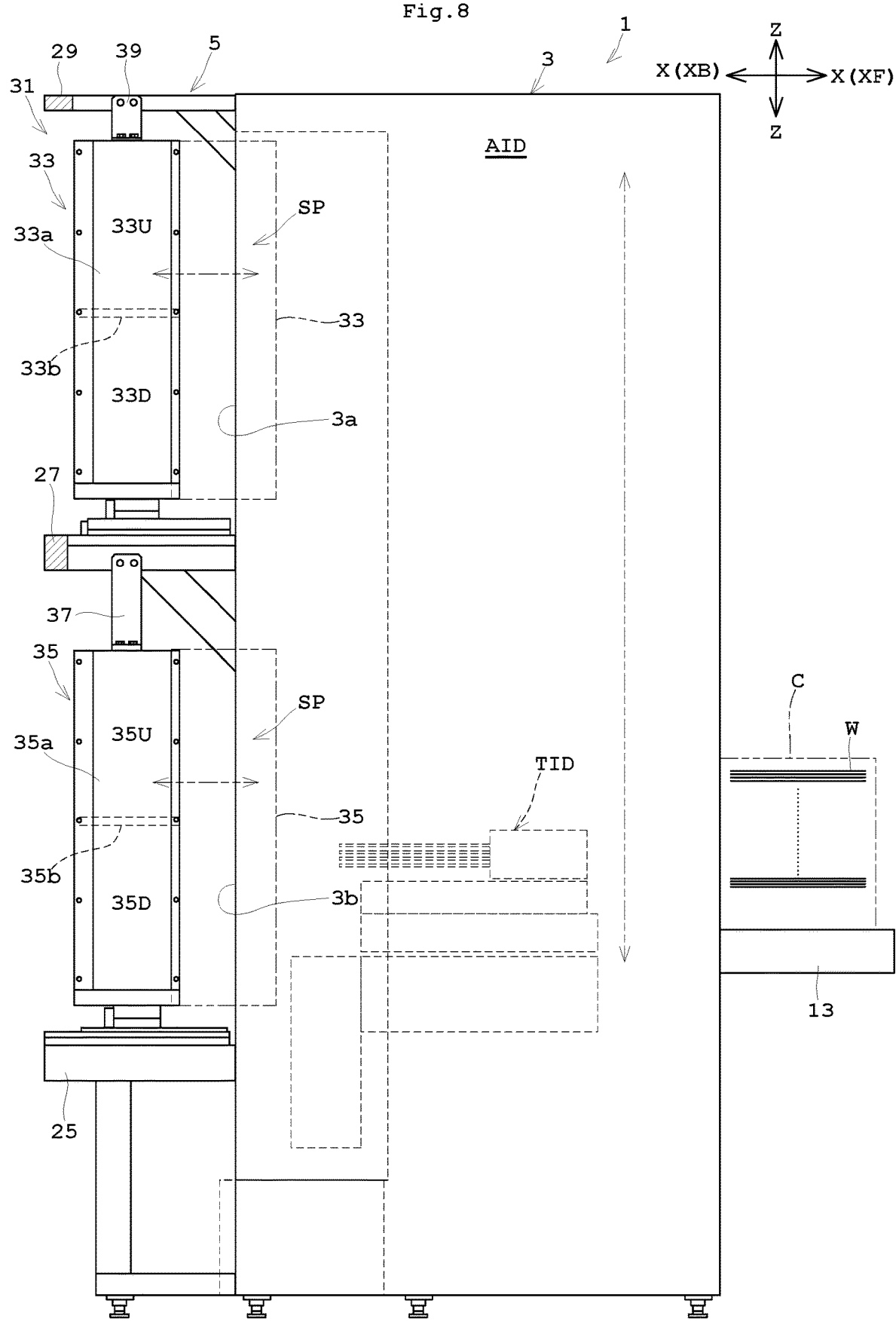
FIG. 8 illustrates the indexer block and the reversing path block seen from a left side thereof.

Reference is now made to FIGS. 7 and 8. FIG. 7 is a perspective view of a reversing path block when the indexer block is seen from a rear face thereof. FIG. 8 illustrates the indexer block and the reversing path block seen from a left side thereof.

The reversing path block 5 is attached integrally to the indexer block 3 adjacent to the treating block 7. Specifically, the indexer block 3 includes a mount frame 25, a mount suspending frame 27, and a suspending frame 29 on its rear face side (backward XB thereof). These frames protrude from the indexer block 3 toward the treating block 7. The reversing path block 5 includes a reversing path unit 31. An upper access opening 3a and a lower access opening 3b in communication with the transportation space AID are formed on the rear face of the indexer block 3. The reversing path unit 31 includes an upper reversing path unit 33 and a lower reversing path unit 35. The upper reversing path unit 33 is positioned in correspondence to the upper access opening 3a, and the lower reversing path unit 35 is positioned in correspondence to the lower access opening 3b. A lower portion of the lower reversing path unit 35 is screwed on the mount frame 25. An upper portion of the lower reversing path unit 35 is fixed to the mount suspending frame 27 with a fixing member 37. Moreover, a lower portion of the upper reversing path unit 33 is screwed on the mount suspending frame 27. An upper portion of the upper reversing path unit 33 is fixed to the suspending frame 29 with a fixing member 39.

The upper reversing path unit 31 and the lower reversing path unit 33 are disposed so as to overlap each other without shifting each other in the front-back direction X and the width direction Y in plan view. Accordingly, this achieves a small footprint of the substrate treating apparatus 1.

The reversing path block 5 is configured integrally with the indexer block 3. When the substrate treating apparatus 1 is conveyed, at least a part of the reversing path block 5 can be accommodated inside of the indexer block 3.

Specifically, screws used for fixing the lower portions of the upper reversing path unit 33 and the lower reversing path unit 35 are firstly undone. Then, the fixing members 37, and 39 are removed. Moreover, the upper reversing path unit 33 is pushed into the space SP inside of the indexer block 3 from the upper access opening 3a. Finally, the lower reversing path unit 35 is pushed into the space SP inside of the indexer block 3 from the lower access opening 3b. Accordingly, at least a part of the reversing path block 5 is reliably accommodatable inside of the indexer block 3.

The upper reversing path unit 33 includes a reversing path casing 33a and a casing partition 33b. An upper reversing path portion 33U is disposed in an upper part of the upper reversing path unit 33, the upper part being divided by the casing partition 33b. A lower reversing path portion 33D is disposed in a lower part of the upper reversing path unit 33, the lower part being divided by the casing partition 33b. Moreover, the lower reversing path unit 35 includes a reversing path casing 35a and a casing partition 35b. An upper reversing path portion 35U is disposed in an upper part of the lower reversing path unit 35, the upper part being divided by the casing partition 35b. A lower reversing path portion 35D is disposed in a lower part of the lower reversing path unit 35, the lower part being divided by the casing partition 33b.

The following describes the reversing path unit 31 in detail with reference to FIGS. 9 and 10. FIG. 9 is a perspective view of a principal part of the reversing path unit. FIGS. 10A to 10D are operational views of the reversing path unit.

The reversing path unit 31 includes the upper reversing path unit 33 and the lower reversing path unit 35. The upper reversing path unit 33 and the lower reversing path unit 35 include the upper reversing path portions 33U, 35U and the lower reversing path portions 33D, 35D, respectively. The following describes the upper reversing path portion 33U as one example. It should be noted that the same configuration is applied to the upper reversing path portion 35U, and the lower reversing path portions 33D and 35D.

The upper reversing path portion 33U includes a guide portion 41 and a spin holder 43. The guide portion 41 places substrates W thereon. The spin holder 43 rotates so as to reverse a face of the substrate W placed on the guide portion 41. Here, a similar guide portion 41 faces a similar spin holder 43 on a rightward RY side, which is not shown for convenience of illustration. The guide portion 41 includes a plurality of (e.g., ten stages in total of five stages plus five stages) shelves 45 that are spaced apart in the front-back direction X. The shelves 45 holds a plurality of substrates W in a horizontal posture in a stacked manner. The guide portion 41 is driven by a driving unit (not shown) between a mount position (not shown) protruding rightward YR and a retracting position retreated leftward YL as shown in FIG. 9. The retracting position corresponds to a diagonally downward direction downward with respect to a leftward YL direction from the back face of the substrate W. This prevents slide of the guide portion 41 to the back face of the substrate W while the guide portion 41 retreats. Here, the guide portion 41, not shown, is driven between a mount position protruding leftward YL and a retracting position retreated diagonally downward with respect to the rightward YR direction.

The spin holder 43 is disposed between the guide portions 41. The spin holder 43 includes shelves 47 whose number is equal to those of the guide portions 41 (ten stages in total).

The shelves 47 are positioned in the up-down direction Z in the same level as the shelves 45 of the guide portions 41 when the guide portions 41 are located in the mount position. The shelves 47 each include a gripper (not shown) for slightly gripping both faces of the substrate W. This achieves prevention of the substrates W from dropping off the shelves 47. The spin holder 43 is attached to a rotating member 49. The spin holder 43 includes shelves 47. The shelves 47 are separated into two parts that are apart from each other in the front-back direction X. In this embodiment, the rotating member 49 has a shape of the alphabet H. The shelves 47 are disposed at I-shaped parts at both ends of the H-shaped rotating member 49. The rotating member 49 is connected to a rotation driving unit and an advancing/retreating unit, both of which are not shown. The rotating member 49 rotates around a rotary axis P4 along the width direction Y. Moreover, the rotating member 49 advances and retreats between a grip position protruding rightward YR shown in FIG. 9 and a retracting position (not shown) retreated leftward YL. Such operation as above causes the shelves 47 to rotate or advance and retreat. Here, the rotating member 49, not shown, advances and retreats between the grip position protruding leftward YL and the retracting position retreated rightward YR.

Figure 10A:
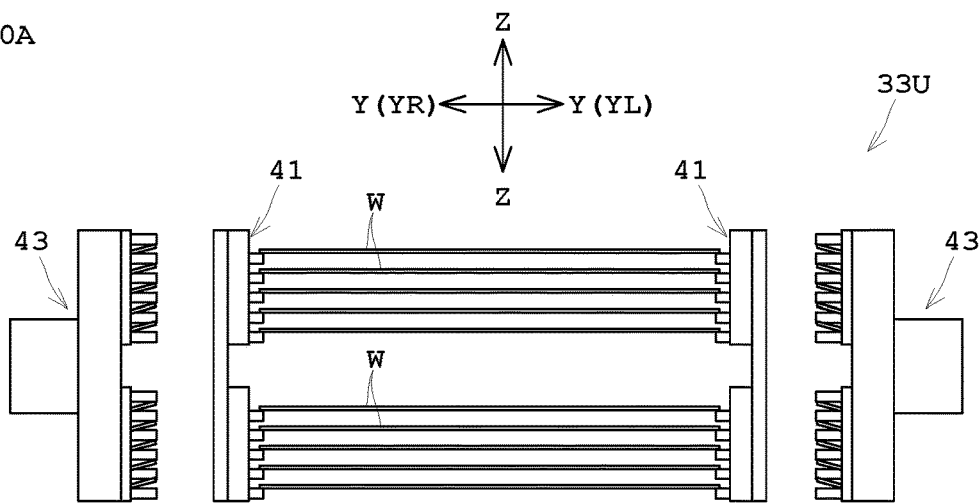
FIGS. 10A to 10D are operational views of the reversing path unit.

The upper reversing path portion 33U described above places thereon a plurality of substrates W without reversing the faces of the substrates W, and delivers the substrates W kept in a state as shown in FIG. 10A. Moreover, with such operation as shown in FIG. 10A to 10D, the faces of the substrates W are reversed and then delivered.

When the faces of the substrates W are reversed, the guide portions 41 and the spin holders 43 are driven in such a manner as below, for example.

Figure 10B:
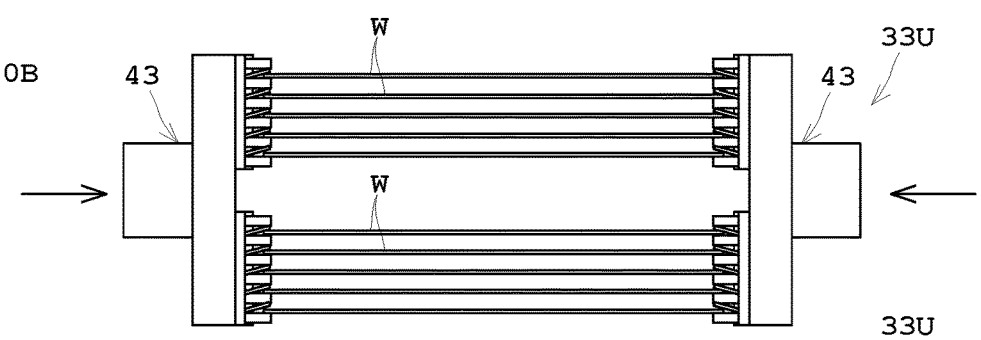
Figure 10C:
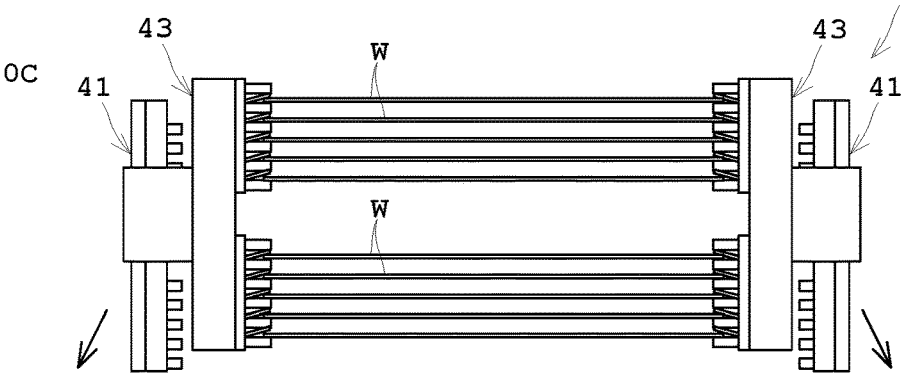
Figure 10D:
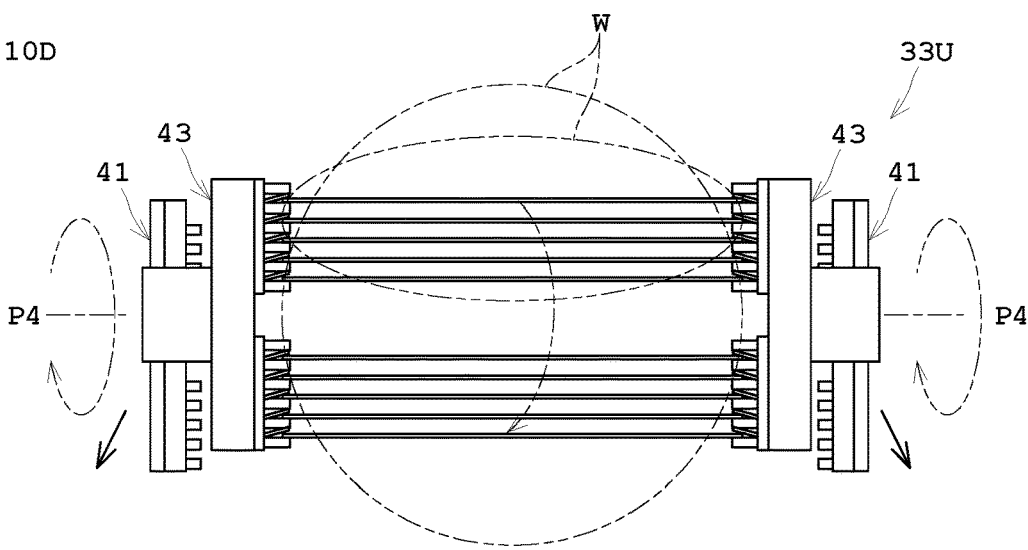

In an initial condition, the guide portions 41 are moved to the mount positions where they are spaced apart from each other in the width direction Y by a gap substantially equal to a diameter of the substrate W. The spin holders 43 are moved to the retracting positions (FIG. 10A). Under such a condition, the substrates W are placed on the guide portions 41. Then, the spin holders 43 are positioned to the grip positions (FIG. 10B). Then, the guide portions 41 are moved to the retracting positions (FIG. 10C). Moreover, the spin holders 43 rotate halfway around the rotary axis P4 (FIG. 10D). A series of such operation as above achieves reverse of the substrates W simultaneously.

Here, the upper reversing path portion 33U and the lower reversing path portion 33D, and the upper reversing path portion 35U and the lower reversing path portion 35D correspond to a "separated reversing path unit" in the present invention.

Figure 11:
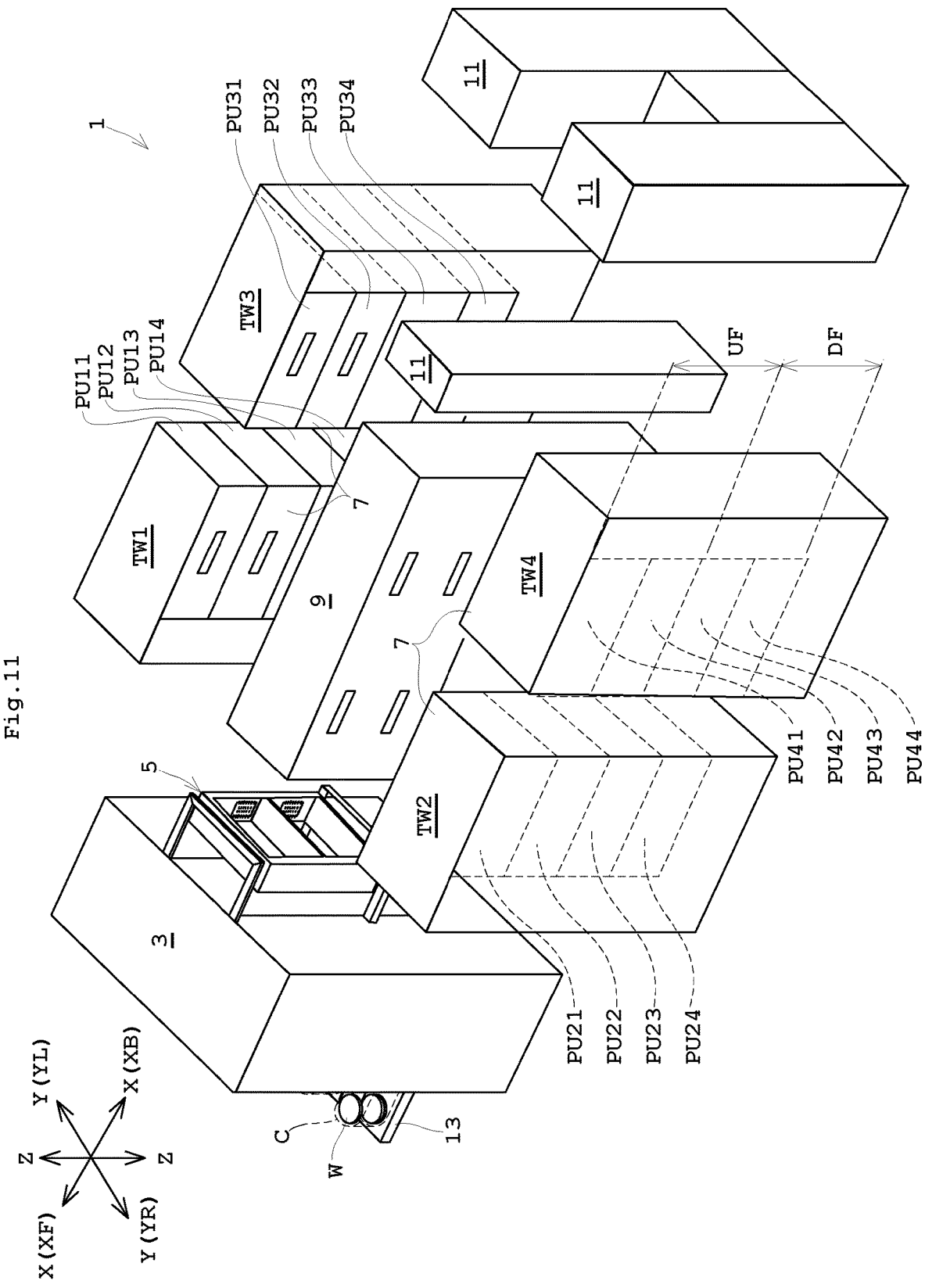
FIG. 11 is an exploded perspective view during conveyance of the substrate treating apparatus.

Reference is made again to FIGS. 2 to 4. Reference is also made to FIG. 11. FIG. 11 is an exploded perspective view during conveyance of the substrate treating apparatus.

The treating blocks 7 and the transportation block 9 are disposed backward XB of the reversing path block 5. The treating blocks 7 are disposed leftward YL and rightward YR across the transportation block 9 so as to face each other.

The treating blocks 7 each include two layers of treating units PU in each of an upper stage UF and a lower stage DF. Moreover, the treating blocks 7 each include two treating units PU in the front-back direction X. That is, one treating block 7 includes eight treating units PU. Accordingly, the two treating blocks 7 includes 16 treating units PU in total. In the following description, four treating units PU formed by an upper most treating unit PU on a leftward YL and frontward XF side to a lowermost one arranged downward are referred to as treating units PU11 to PU14, respectively, as shown in FIG. 11, when the treating units PU are needed to be distinguished. Similarly, four treating units PU formed by an upper most treating unit PU on a rightward YR and frontward XF side to a lowermost one arranged downward are referred to as treating units PU21 to PU24, respectively. Similarly, four treating units PU formed by an upper most treating unit PU on a leftward YL and backward XB side to a lowermost one arranged downward are referred to as treating units PU31 to PU34, respectively. Similarly, four treating units PU formed by an upper most treating unit PU on a rightward YR and backward XB side to a lowermost one arranged downward are referred to as treating units PU41 to PU44, respectively.

Four treating units PU11 to PU14 on the leftward YL and frontward XF side are collectively referred to as a tower unit TW1. Four treating units PU21 to PU24 on the rightward YR and frontward XF side are collectively referred to as a tower unit TW2. Four treating units PU31 to PU34 on the leftward YL and backward XB side are collectively referred to as a tower unit TW3. Four treating units PU41 to PU44 on the rightward YR and backward XB side are collectively referred to as a tower unit TW4. Here, the two treating units 7 are formed with the four tower units TW1 to TW4. On the other hand, the tower units TW1 to TW4 are controlled and handled individually, and are capable of connecting and disconnecting electric wires and flow paths individually.

As illustrated in FIG. 2, an upper layer of the upper stage UF of the treating block 7 includes front face cleaning units SS, for example. The front face cleaning unit SS cleans the front face of the substrate W. Typically, the front face of the substrate W includes electronic circuit patterns formed thereon. The front face cleaning unit SS includes, for example, a suction chuck 51, a guard 53, and a treating nozzle 55. The suction chuck 51 suction-holds around a center portion of a rear surface of the substrate W, thereby sucking the substrate W. The suction chuck 51 is rotated by an electric motor, not shown. This causes the suction chuck 51 to rotate the substrate W in a horizontal plane. The guard 53 is arranged so as to surround the side of the suction chuck 51 laterally. The guard 53 prevents scattering of a treatment liquid, supplied from the treating nozzle 55 to the substrate W, to the surrounding. The treating nozzle 55 supplies the treatment liquid to the front face of the substrate W with jet stream. This causes the treating nozzle 55 to clean the front face of the substrate W.

As illustrated in FIG. 3, a lower layer of the upper stage UF of the treating block 7 includes back face cleaning units SSR, for example. The back face cleaning unit SSR cleans a back face of the substrate W. Typically, the back face of the substrate W includes no electronic circuit patterns formed thereon. The back face cleaning unit SSR includes, for example, a mechanical chuck 57, a guard 59, and a cleaning brush 61. The mechanical chuck 57 supports against a periphery portion of the substrate W, and supports the substrate W in a horizontal posture without contacting a large part of the back face of the substrate W. The mechanical chuck 57 is rotated by an electric motor, not shown. This causes the mechanical chuck 57 to rotate the substrate W in a horizontal plane. The guard 59 is arranged so as to surround the side of the mechanical chuck 57 laterally. The guard 59 prevents scattering of a treatment liquid to the surrounding by the cleaning brush 61. The cleaning brush 61 includes a brush portion, for example, that rotates around a longitudinal axis. The cleaning brush 61 performs cleaning by applying the supplied treatment liquid to the back face of the substrate W with use of a rotation force of the brush portion.

The lower stage DF of the treating block 7 in this embodiment is configured in the same manner as that of the upper and lower layers of the upper stage UF described above. That is, an upper layer of the lower stage DF of the treating block includes front face cleaning units SS. A lower layer of the lower stage DF of the treating block includes back face cleaning units SSR. In other words, 16 treating units PU in total of the treating blocks 7 include eight front face cleaning units SS and eight back face cleaning units SSR.

Figure 12:
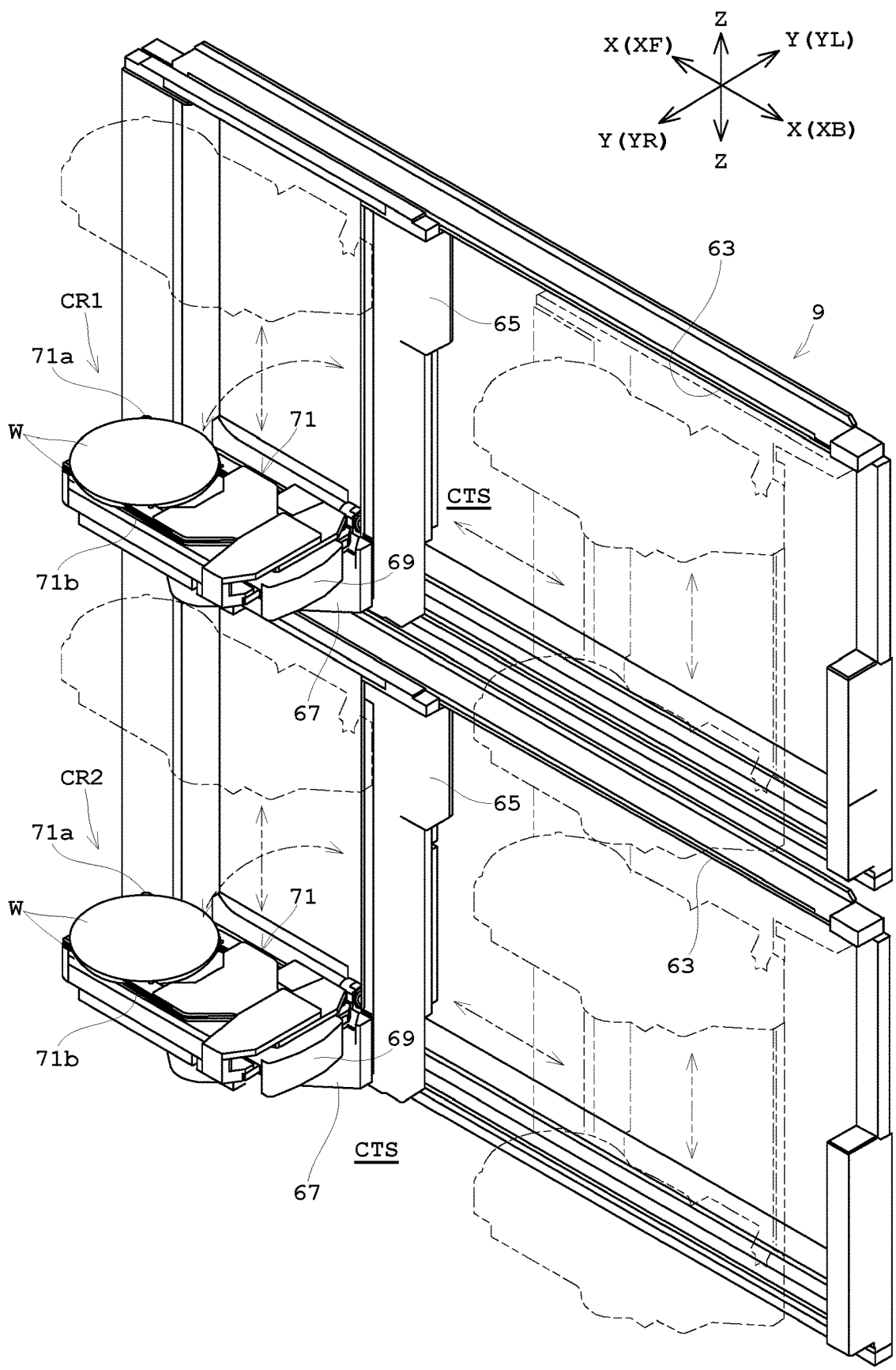
FIG. 12 is a perspective view of a principal part of a transportation block.

Reference is now made to FIG. 12 in addition to FIGS. 2 to 4. FIG. 12 is a perspective view of a principal part of a transportation block.

The transportation block 9 includes center robots CR1 and CR2 positioned so as to correspond to the upper stage UF and the lower stage DF. The transportation block 9 includes no partitions across a boundary between the upper stage UF and the lower stage DF. Accordingly, the transportation block 9 achieves down-flow from the upper stage UF to the lower stage DF within the apparatus. The center robot CR1 transports a substrate W between the upper reversing path unit 33 in the reversing path block 5 and the treating units PU in the upper stage UF. Moreover, the center robot CR2 transports the substrate W between the lower reversing path unit 35 in the reversing path block 5 and the treating units PU in the lower stage DF. As described above, the substrates W can be distributed to the treating blocks 7 in the upper stages UF and the lower stages DF with the center robots CR1 and CR2 via the upper reversing path unit 33 and the lower reversing path unit 35 in the reversing path block 5. This achieves enhanced throughput.

The center robot CR1 is configured in the same manner as the center robot CR2. Accordingly, the following description is made taking the center robot CR1 as one example.

The center robot CR1 includes a fixed frame 63, a movable frame 65, a base 67, a pivotable base 69, and an arm 71. The fixed frame 63 has an opening extending over the treating units PU in the upper stage UF. The movable frame 65 is attached in the fixed frame 63 so as to be movable in the front-back direction X. The base 67 is attached to a lower one of four frame members that form the movable frame 65. The pivotable base 69 is installed in an upper part of the base 67. The pivotable base 69 is movable with respect to the base 67 in a horizontal plane. The arm 71 is installed in an upper part of the pivotable base 69 so as to advance and retreat with respect to the pivotable base 69. The arm 71 is disposed such that an arm body 71*b* is stacked on the arm body 71*a*. The arm 71 is configured so as to advance and retreat between a first position where the arm 71 overlaps the pivotable base 69 and a second position where the arm 71 protrudes from the pivotable base 69. With such a configuration, when the center robot CR1 accesses the treating unit PU, the center robot CR1 receives a substrate W, treated in the treating unit PU, with the arm body 71*a* while the pivotable base 69 faces the treating unit PU. The center robot CR1 can deliver an untreated substrate W, supported by the arm body 71*b*, to the treating unit PU.

The transportation block 9 is configured in such a manner as described above, and there is no frame common to two adjacent treating blocks 7 in the width direction Y. Consequently, the transportation block 9 is separable from the adjacent treating blocks 7. Moreover, as shown in FIG. 11, the substrate treating apparatus 1 configured as above is separable into the indexer block 3 to which the reversing path block 5 is attached integrally, the treating blocks 7, the transportation block 9, and the utility block 11 for conveyance. Moreover, the treating blocks 7 are separable into the four tower units TW1 to TW4. Consequently, restriction in height, width and depth during conveyance by an aircraft can be resolved. Moreover, as shown in FIG. 8, the reversing path block 5 attached to the indexer block 3 integrally can be partially accommodated inside of the indexer block 3. Consequently, restriction in volume in addition to restriction in height, width and depth during conveyance by an aircraft can be resolved.

Arrangement Example 1

Figure 13:
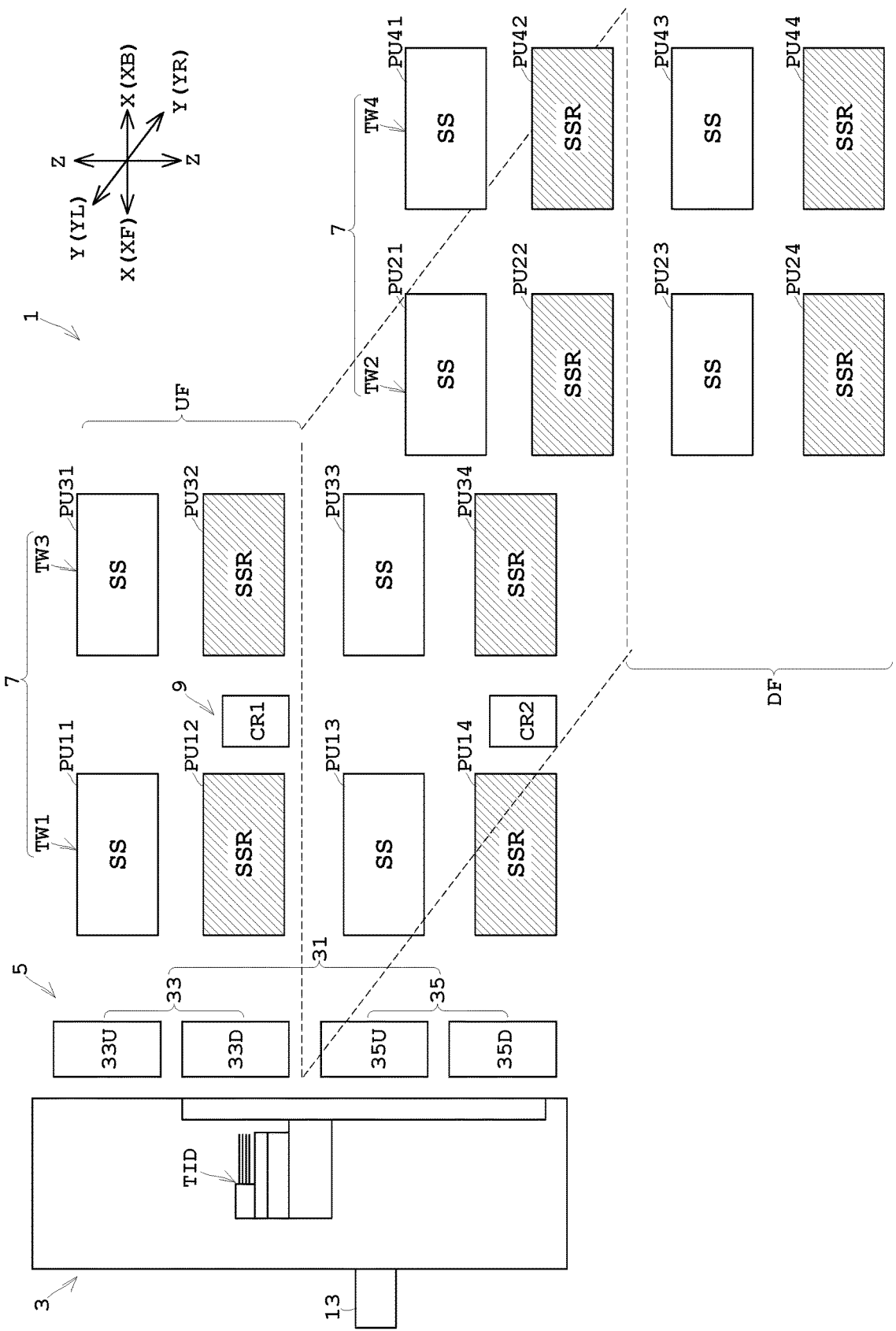
FIG. 13 is a schematic view of an arrangement example 1 of treating units in the treating block.

Reference is now made to FIG. 13. FIG. 13 is a schematic view of an arrangement example 1 of the treating units in the treating block.

The treating blocks 7 described above are each formed by the four tower units TW1 to TW4. The tower units TW1 to TW4 are preferably configured as under, for example.

The tower unit TW1 includes a front face cleaning unit SS as the treating unit PU11 on the upper stage UF. The tower unit TW1 includes a back face cleaning unit SSR as the treating unit PU12 on the upper stage UF. The tower unit TW1 includes a front face cleaning unit SS as the treating unit PU13 on the lower stage DF. The tower unit TW1 includes a back face cleaning unit SSR as the treating unit PU14 on the lower stage DF. The tower unit TW2 includes a front face cleaning unit SS as the treating unit PU21 on the upper stage UF. The tower unit TW2 includes a back face cleaning unit SSR as the treating unit PU22 on the upper stage UF. The tower unit TW2 includes a front face cleaning unit SS as the treating unit PU23 on the lower stage DF. The tower unit TW2 includes a back face cleaning unit SSR as the treating unit PU24 on the lower stage DF. The tower unit TW3 includes a front face cleaning unit SS as the treating unit PU31 on the upper stage UF. The tower unit TW3 includes a back face cleaning unit SSR as the treating unit PU32 on the upper stage UF. The tower unit TW3 includes a front face cleaning unit SS as the treating unit PU33 on the lower stage DF. The tower unit TW3 includes a back face cleaning unit SSR as the treating unit PU34 on the lower stage DF. The tower unit TW4 includes a front face cleaning unit SS as the treating unit PU41 on the upper stage UF. The tower unit TW4 includes a back face cleaning unit SSR as the treating unit PU42 on the upper stage UF. The tower unit TW4 includes a front face cleaning unit SS as the treating unit PU43 on the lower stage DF. The tower unit TW4 includes a back face cleaning unit SSR as the treating unit PU44 on the lower stage DF.

That is, in the arrangement example 1 described above, the tower units TW1 to TW4 each include two treating units PU in the upper stage UF and the lower stage DF respectively. The tower units TW1 to TW4 each include one front face cleaning unit SS and one back face cleaning unit SSR in the upper stage UF. The tower units TW1 to TW4 each include one front face cleaning unit SS and one back face cleaning unit SSR in the lower stage DF. It should be noted that a vertical positional relationship between the front face cleaning unit SS and the back face cleaning unit SSR may be changed between the upper stage UF and the lower stage DF.

As described above, the treating blocks 7 include four tower units TW1 to TW4 in the arrangement example 1. The tower units TW1 to TW4 each include two treating units PU in the upper stage UF and the lower stage DF respectively. The tower units TW1 to TW4 each include one front face cleaning unit SS and one back face cleaning unit SSR in the upper stage UF. The tower units TW1 to TW4 each include one front face cleaning unit SS and one back face cleaning unit SSR in the lower stage DF. The transportation block 9 includes the center robots CR1 and CR2 provided in the upper stage UF and the lower stage DF, respectively, in the treating blocks 7. This achieves enhanced throughput. In the arrangement example 1, it is assumed that either the center robot CR1 or CR2 in the upper stage UF or the lower stage DF breaks down or either all the treating units PU11, PU12, PU21, PU22, PU31, PU32, PU41, PU42 in the upper stage UF or all the treating units PU13, PU14, PU23, PU24, PU33, PU34, PU43, PU44 in the lower stage DF break down. In such a case, the treating units PU on either the upper stage UF or the lower stage DF not breaking down can perform a front-back face cleaning treatment. Accordingly, the front-back face cleaning treatment can be performed even when either the structure of the upper stage UF or the structure of the lower stage DF breaks down.

Moreover, as described above, the reversing path block 5 includes the upper reversing path unit 33 on the upper stage UF and the lower reversing path unit 35 on the lower stage DF. This achieves front-back face cleaning treatment in each of the upper stage UF and the lower stage DF. Moreover, the upper reversing path unit 33 on the upper stage UF includes the upper reversing path portion 33U and the lower reversing path portion 33D. The lower reversing path unit 35 on the lower stage DF includes the upper reversing path portion 35U and the lower reversing path portion 35D. At least two parts, i.e., the upper stage UF and the lower stage DF include a plurality of shelves 45, 47 and have reversing functions, respectively. Accordingly, operation of only delivering a substrate W without reversing the substrate for the front face cleaning treatment and operation of reversing the substrate W for the back face cleaning can be performed in parallel in each of the upper stage UF and the lower stage DF. This results in efficient operation of the front-back face cleaning treatment in the upper stage UF and the lower stage DF.

Arrangement Example 2

Figure 14:
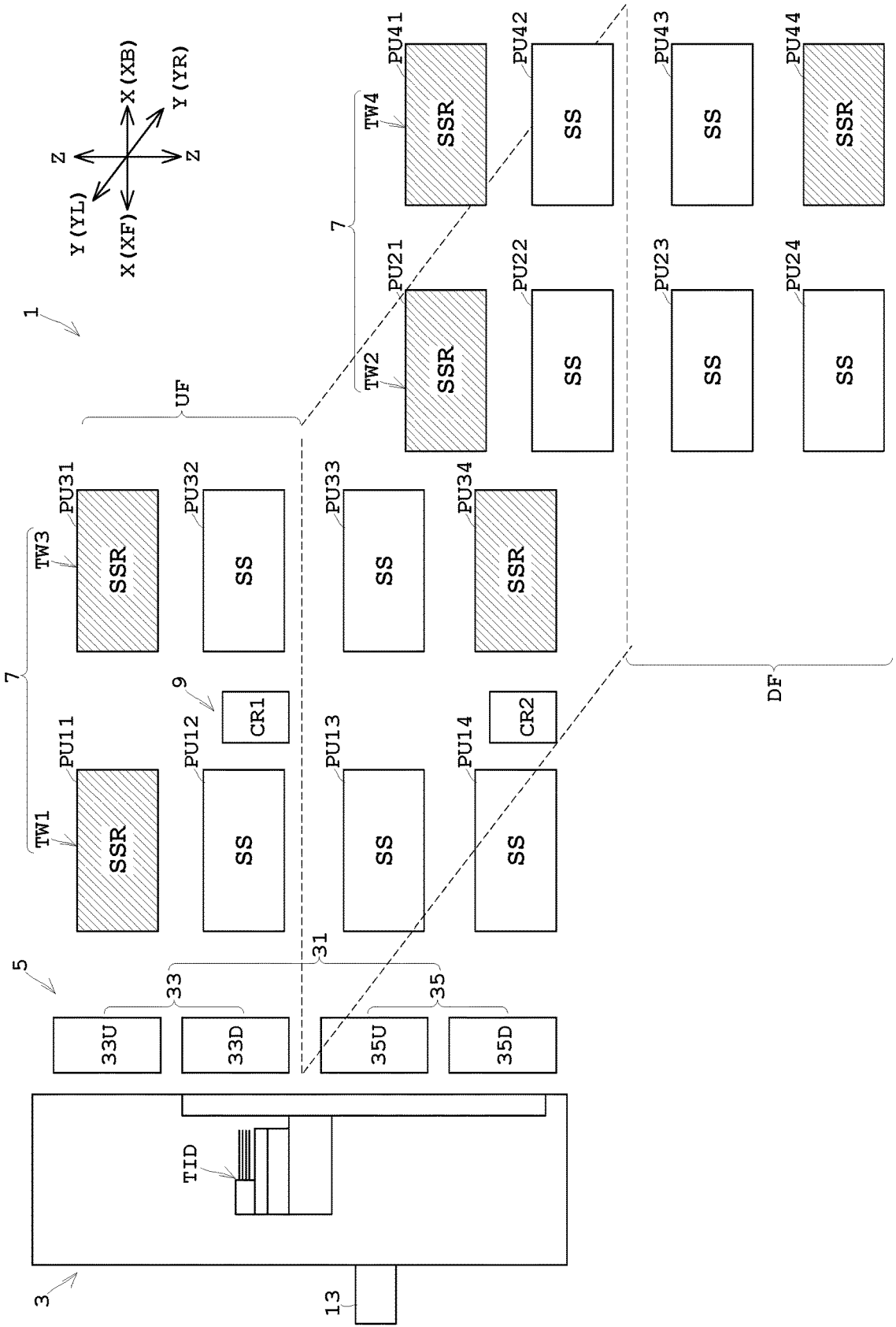
FIG. 14 is a schematic view of an arrangement example 2 of treating units in the treating block.

Reference is now made to FIG. 14. FIG. 14 is a schematic view of an arrangement example 2 of treating units in the treating block.

The four tower units TW1 to TW4 of the treating blocks 7 may be configured as under, for example.

The tower unit TW1 includes a back face cleaning unit SSR as the treating unit PU11 on the upper stage UF. The tower unit TW1 includes a front face cleaning unit SS as the treating unit PU12 on the upper stage UF. The tower unit TW1 includes front face cleaning units SS as the treating units PU13, and PU14 on the lower stage UF. Similar to the tower unit TW1, the tower unit TW2 includes a back face cleaning unit SSR as the treating unit PU21 on the upper stage UF. The tower unit TW2 includes a front face cleaning unit SS as the treating unit PU22 on the upper stage UF. The tower unit TW2 includes front face cleaning units SS as the treating units PU23 and PU24 on the lower stage DF. The tower unit TW3 includes a back face cleaning unit SSR as the treating unit PU31 on the upper stage UF. The tower unit TW3 includes a front face cleaning unit SS as the treating unit PU32 on the upper stage UF. The tower unit TW3 includes a front face cleaning unit SS as the treating unit PU33 on the lower stage UF. The tower unit TW3 includes a back face cleaning unit SSR as the treating unit PU34 on the lower stage DF. Similar to the tower unit TW3, the tower unit TW4 includes a back face cleaning unit SSR as the treating unit PU41 on the upper stage UF. The tower unit TW4 includes a front face cleaning unit SS as the treating unit PU42 on the upper stage UF. The tower unit TW4 includes a front face cleaning unit SS as the treating unit PU43 on the lower stage UF. The tower unit TW4 includes a back face cleaning unit SSR as the treating unit PU44 on the lower stage DF.

In other words, the treating block 7 in the arrangement example 2 includes the four tower units TW1 to TW4. The tower units TW1 and TW2 adjacent to the reversing path block 5 includes a larger number of front face cleaning units SS than that of the tower units TW3 and TW4 further from the reversing path block 5 than the tower units TW1 and TW2.

In a cleaning treatment for cleaning both faces of the substrate W, the front face cleaning treatment is typically performed more frequently than the back face cleaning treatment. Accordingly, since the tower units TW1 and TW2 adjacent to the reversing path block 5 includes more front face cleaning units SS, leading to reduction in transportation time by the center robots CR1 and CR2 in the front-back direction X. This achieves efficient operation of the front face cleaning treatment to the substrate W.

Arrangement Example 3

Figure 15:
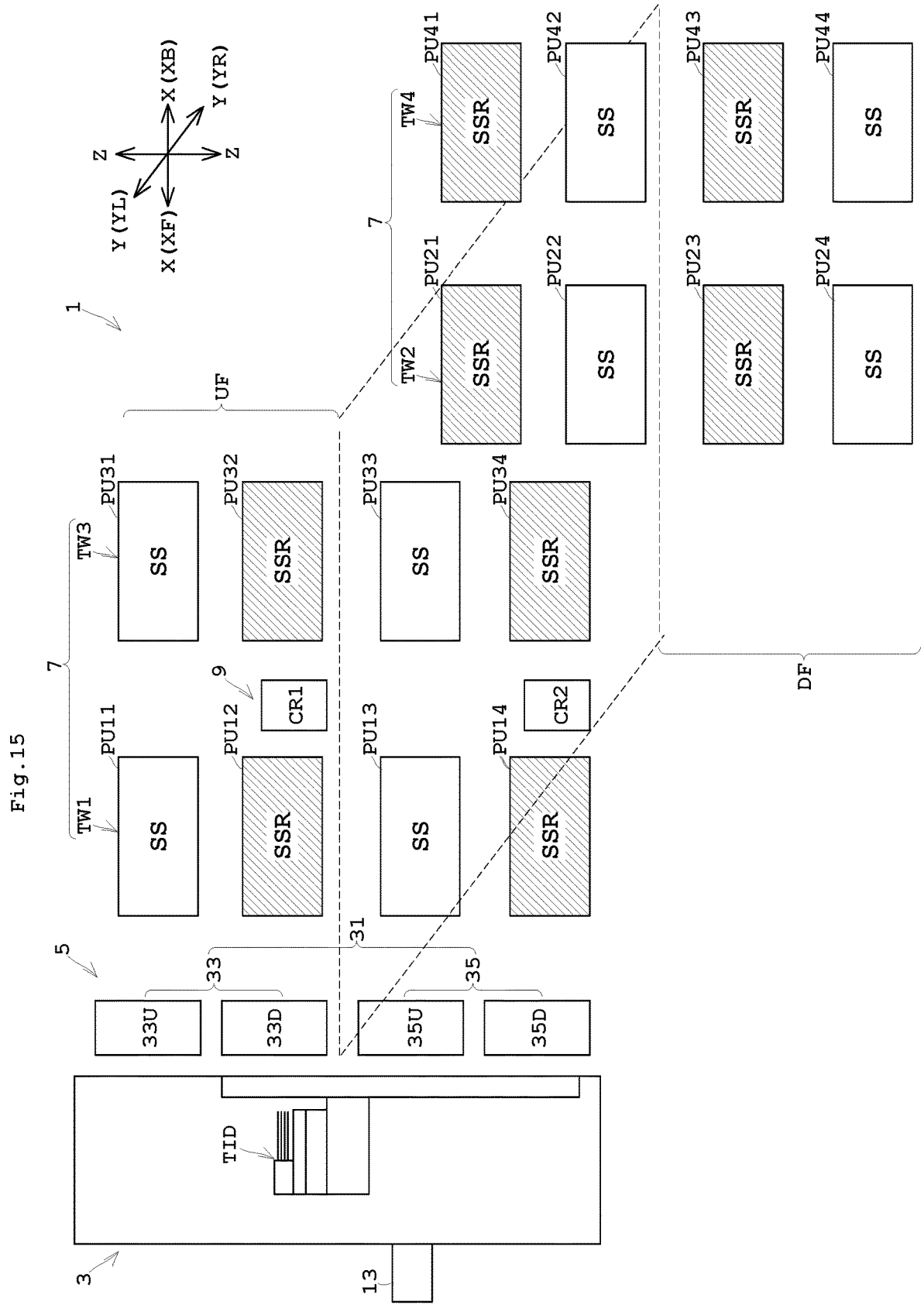
FIG. 15 is a schematic view of an arrangement example 3 of treating units in the treating block.

Reference is now made to FIG. 15. FIG. 15 is a schematic view of an arrangement example 3 of treating units in the treating block.

It is preferred that the four tower units TW1 to TW4 of the treating blocks 7 may be configured as under.

Similar to the arrangement example 1 described above, the tower unit TW1 includes a front face cleaning unit SS as the treating unit PU11 on the upper stage UF. The tower unit TW1 includes a back face cleaning unit SSR as the treating unit PU12 on the upper stage UF. The tower unit TW1 includes a front face cleaning unit SS as the treating unit PU13 on the lower stage DF. The tower unit TW1 includes a back face cleaning unit SSR as the treating unit PU14 on the lower stage DF. The tower unit TW2 includes a back face cleaning unit SSR as the treating unit PU21 on the upper stage UF. The tower unit TW2 includes a front face cleaning unit SS as the treating unit PU22 on the upper stage UF. The tower unit TW2 includes a back face cleaning unit SSR as the treating unit PU23 on the lower stage DF. The tower unit TW2 includes a front face cleaning unit SS as the treating unit PU24 on the lower stage DF. Similar to the arrangement example 1 described above, the tower unit TW3 includes a front face cleaning unit SS as the treating unit PU31 on the upper stage UF. The tower unit TW3 includes a back face cleaning unit SSR as the treating unit PU32 on the upper stage UF. The tower unit TW3 includes a front face cleaning unit SS as the treating unit PU33 on the lower stage DF. The tower unit TW3 includes a back face cleaning unit SSR as the treating unit PU34 on the lower stage DF. The tower unit TW4 includes a back face cleaning unit SSR as the treating unit PU41 on the upper stage UF. The tower unit TW4 includes a front face cleaning unit SS as the treating unit PU42 on the upper stage UF. The tower unit TW4 includes a back face cleaning unit SSR as the treating unit PU43 on the lower stage DF. The tower unit TW4 includes a front face cleaning unit SS as the treating unit PU44 on the lower stage DF.

In other words, in the arrangement example 3 described above, the tower unit TW1 and the tower unit TW2 each include the front face cleaning units SS and the back face cleaning units SSR across the center robots CR1 and CR2 at positions same in level. The tower unit TW3 and the tower unit TW4 each include the front face cleaning units SS and the back face cleaning units SSR across the center robots CR1 and CR2 at positions same in level. Consequently, the center robots CR1 and CR2 can prevent movement in the up-down direction Z while the substrate W is transported between the front face cleaning unit SS and the back face cleaning unit SSR via the reversing path block 5. This results in enhanced transportation efficiency of the substrates W.

Arrangement Example 4

Figure 16:
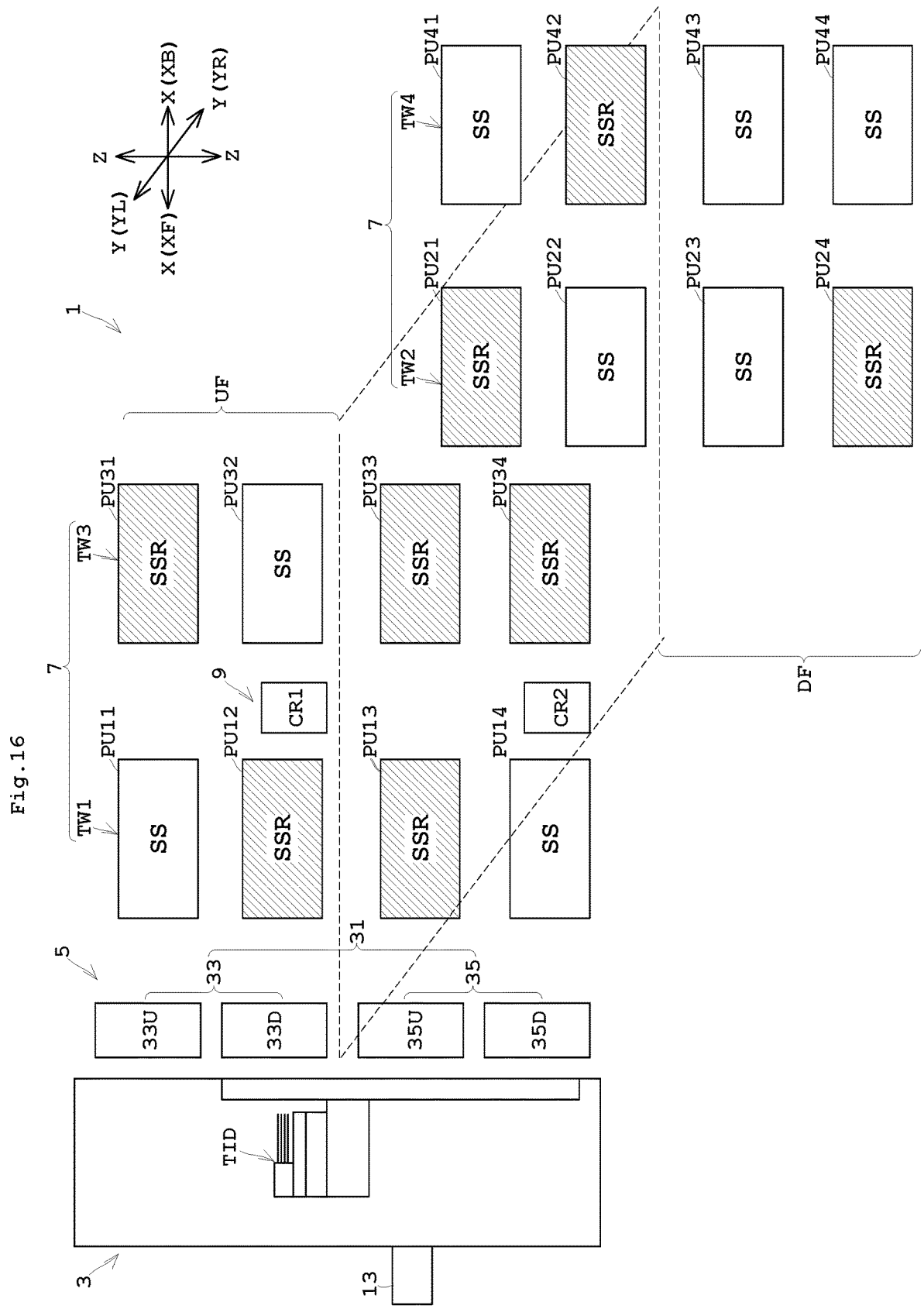
FIG. 16 is a schematic view of an arrangement example 4 of treating units in the treating block.

Reference is now made to FIG. 16. FIG. 16 is a schematic view of an arrangement example 4 of treating units in the treating block.

It is preferred that the four tower units TW1 to TW4 of the treating blocks 7 may be configured as under.

The tower unit TW1 includes a front face cleaning unit SS as the treating unit PU11 on the upper stage UF. The tower unit TW1 includes a back face cleaning unit SSR as the treating unit PU12 on the upper stage UF. The tower unit TW1 includes a back face cleaning unit SSR as the treating unit PU13 on the lower stage DF. The tower unit TW1 includes a front face cleaning unit SS as the treating unit PU14 on the lower stage DF. The tower unit TW2 includes a back face cleaning unit SSR as the treating unit PU21 on the upper stage UF. The tower unit TW2 includes a front face cleaning unit SS as the treating unit PU22 on the upper stage UF. The tower unit TW2 includes a front face cleaning unit SS as the treating unit PU23 on the lower stage DF. The tower unit TW2 includes a back face cleaning unit SSR as the treating unit PU24 on the lower stage DF. The tower unit TW3 includes a back face cleaning unit SSR as the treating unit PU31 on the upper stage UF. The tower unit TW3 includes a front face cleaning unit SS as the treating unit PU32 on the upper stage UF. The tower unit TW3 includes a back face cleaning unit SSR as the treating unit PU33 on the lower stage DF. The tower unit TW3 includes a back face cleaning unit SSR as the treating unit PU34 on the lower stage DF. The tower unit TW4 includes a front face cleaning unit SS as the treating unit PU41 on the upper stage UF. The tower unit TW4 includes a back face cleaning unit SSR as the treating unit PU42 on the upper stage UF. The tower unit TW4 includes a front face cleaning unit SS as the treating unit PU43 on the lower stage DF. The tower unit TW4 includes a front face cleaning unit SS as the treating unit PU44 on the lower stage DF.

That is, in the arrangement example 4, the tower unit TW1 adjacent to the reversing path block 5 includes the back face cleaning units SSR across a boundary between the upper stage UF and the lower stage DF.

As described above, the back face cleaning units SSR are disposed across the boundary between the upper stage UF and the lower stage DF. Accordingly, this leads to a reduction in distance of the vertical movement of the indexer robot TID in the back face cleaning treatment more frequently. This results in an enhanced operational efficiency in the back face cleaning treatment.

Moreover, in the arrangement example 1 described above, the tower unit TW1, adjacent to the reversing path block 5, of the tower units TW1 to TW4 includes a pair of the front face treating unit SS and the back face treating unit SSR adjacent to each other in the up-down direction Z. Specifically, the tower unit TW1 includes the treating units PU11 and PU12, and the treating units PU13 and PU14. Similar to the tower unit TW1, the tower unit TW2 adjacent to the reversing path block 5 includes a pair of the front face treating unit SS and the back face treating unit SSR adjacent to each other in the up-down direction Z. Specifically, the tower unit TW2 includes the treating units PU21 and PU22, and the treating units PU23 and PU24.

Moreover, in the arrangement example 2 described above, the tower unit TW1, adjacent to the reversing path block 5, of the tower units TW1 to TW4 includes a pair of the back face treating unit SSR and the front face treating unit SS adjacent to each other in the up-down direction Z. Specifically, the tower unit TW1 includes the treating units PU11 and PU12. The tower unit TW2 adjacent to the reversing path block 5 includes a pair of the back face treating unit SSR and the front face treating unit SS adjacent to each other in the up-down direction Z. Specifically, the tower unit TW2 includes the treating units PU21 and PU22.

Moreover, in the arrangement examples 3 and 4 described above, the tower unit TW1, adjacent to the reversing path block 5, of the tower units TW1 to TW4 includes a pair of the front face treating unit SS and the back face treating unit SSR adjacent to each other in the up-down direction Z. Specifically, the tower unit TW1 includes the treating units PU11 and PU12, and the treating units PU13 and PU14. The tower unit TW2 adjacent to the reversing path block 5 includes a pair of the back face treating unit SSR and the front face treating unit SS adjacent to each other in the up-down direction Z. Specifically, the tower unit TW2 includes the treating units PU21 and PU22, and the treating units PU23 and PU24.

As in the arrangement examples 1 to 4, the one of the tower units TW1 to TW4 adjacent to the reversing path block 5 includes the front face treating unit SS and the back face treating unit SSR adjacent to each other in the up-down direction Z. Accordingly, the center robots CR1 and CR2 can move in a front-back direction X by a shortened distance in the front-back face cleaning treatment. This results in efficient transportation of the substrates W.

Moreover, in the arrangement example 1 described above, the tower units TW1 to TW4 have the same arrangement as that of the tower unit TW1 that the upper stage UF includes the two treating units PU11 and PU12. That is, the lower stage DF includes the two treating units PU13 and PU14 corresponding to the front face treating unit SS on the upper layer and the back face treating unit SSR on the lower layer, respectively.

In the arrangement example 3 described above, the tower units TW1 and TW3 have the same arrangement that the upper stages UF include the two treating units PU11 and PU12 and the two treating units PU31 and PU32, respectively. That is, the lower stages DF include the two treating units PU13 and PU14 and two treating units PU33 and PU34 corresponding to the front face treating units SS on the upper layers and the back face treating units SSR on the lower layers, respectively. Moreover, the tower units TW2 and TW4 have the same arrangement that the upper stages UF include the two treating units PU21 and PU22 and the two treating units PU41 and PU42, respectively. That is, the lower stages DF include the two treating units PU23 and PU24 and two treating units PU43 and PU44 corresponding to the back face treating units SSR on the upper layers and the front face treating units SS on the lower layers, respectively.

With such a configuration, even if one of the treating units PU in either the upper stage UF or the lower stage DF breaks down, the treating units in the other stage can perform treatment continuously through the same transportation path in the up-down direction Z. Consequently, such a treatment so as not to change throughput is performable even when the treating units in the other stage perform treatment.

With this embodiment, the treating block 7 includes at least one tower unit TW1 (or TW2, TW3, or TW4). The tower unit TW1 includes the two treating units PU in the upper stage UF and the lower stage DF respectively. The tower unit TW1 includes one front face cleaning unit SS and one back face cleaning unit SSR in the upper stage UF. The tower unit TW1 includes one front face cleaning unit SS and one back face cleaning unit SSR in the lower stage DF. Moreover, the transportation block 9 includes the center robots CR1 and CR2 provided in the upper stage UF and the lower stage DF, respectively, in the treating blocks 7. This achieves enhanced throughput. With such a configuration, even if either one of the center robots CR1 and CR2 in the upper and lower stages UF and DF breaks down or all the treating units PU in the upper or lower stage UF or DF break down, the other of the upper stage UF or the lower stage DF can perform the front-back face cleaning treatment. Accordingly, the front-back face cleaning treatment can be performed with a configuration that achieves enhanced throughput even when either the structure of the upper stage UF or the structure of the lower layer DF breaks down.

This invention is not limited to the foregoing examples, but may be modified as follows.

(1) In the embodiment described above, the two treating blocks 7 are formed by the four tower units TW1 to TW4. However, such a configuration is not essential to the present invention. The present invention may include at least one tower unit. Moreover, the present invention may include five or more tower units.

(2) In the embodiment described above, the treating blocks 7 include the two-layered treating units PU in the upper stages UF and the lower stages DF. However, the present invention is not limitative to this configuration. For instance, the present invention may include treating unit PU having three or more layers. This achieves treatment to a larger number of substrates W.

(3) In the embodiment described above, the reversing path block 5 includes the upper reversing path unit 33 and the lower reversing path unit 35. The upper reversing path unit 33 includes the upper reversing path portion 33U and the lower reversing path portion 33D. The lower reversing path unit 35 includes the upper reversing path portion 35U and the lower reversing path portion 35D. However, the present invention is not limitative to this configuration. For instance, such a configuration is applicable that the upper reversing path unit 33 and the lower reversing path unit 35 each include one reversing path portion. This achieves a reduction in number of components, leading to suppression of apparatus costs.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a cleaning treatment on a substrate, the apparatus comprising:
    an indexer block including a carrier platform on which a carrier capable of accommodating a plurality of substrates is placed, and an indexer robot configured to transport a substrate to and from the carrier disposed on the carrier platform;
    a treating block including a front face cleaning unit and a back face cleaning unit as treating units, the front face cleaning unit configured to perform a front face cleaning treatment on a substrate and the back face cleaning unit configured to perform a back face cleaning treatment on a substrate; and
    a reversing path block disposed between the indexer block and the treating block, including a plurality of shelves on which the substrates are placed, and having a reversing function of reversing faces of the substrates,
    the treating block including at least one tower unit including a plurality of the treating units in an upper stage and a lower stage thereof respectively, the tower unit including the front face cleaning unit and the back face cleaning unit each provided by at least one in number in the upper stage and the front face cleaning unit and the back face cleaning unit each provided by at least one in number in the lower stage,
    the substrate treating apparatus further comprising:
    a transportation block including a center robot provided in each of the upper stage and the lower stage respectively, and configured to transport a substrate between each of the treating units in the tower unit and the reversing path block.

2. The substrate treating apparatus according to claim 1, wherein
    the reversing path block includes at least two separated reversing path units in each of the upper stage and the lower stage thereof, and
    the reversing path units each include a plurality of shelves where substrates are placed and each have a reversing function of reversing the faces of the substrates.

3. The substrate treating apparatus according to claim 1, wherein
    the treating block includes a plurality of the tower units, and
    one of the tower units adjacent to the reversing path block includes more front face cleaning units than another of the tower units apart from the reversing path block.

4. The substrate treating apparatus according to claim 2, wherein
    the treating block includes a plurality of the tower units, and
    one of the tower units adjacent to the reversing path block includes more front face cleaning units than another of the tower units apart from the reversing path block.

5. The substrate treating apparatus according to claim 3, wherein
    the tower units each include the front face cleaning unit and the back face cleaning unit across the center robot at a position same in level.

6. The substrate treating apparatus according to claim 4, wherein
    the tower units each include the front face cleaning unit and the back face cleaning unit across the center robot at a position same in level.

7. The substrate treating apparatus according to claim 3, wherein
    the one of the tower units adjacent to the reversing path block includes at least one pair of the front face treating unit and the back face treating unit adjacent to each other in an up-down direction.

8. The substrate treating apparatus according to claim 4, wherein
    the one of the tower units adjacent to the reversing path block includes at least one pair of the front face treating unit and the back face treating unit adjacent to each other in an up-down direction.

9. The substrate treating apparatus according to claim 3, wherein the upper stage and the lower stage of the one of the tower units adjacent to the reversing path block include the front face cleaning units across a boundary between the upper stage and the lower stage.

10. The substrate treating apparatus according to claim 4, wherein
the upper stage and the lower stage of the one of the tower units adjacent to the reversing path block include the front face cleaning units across a boundary between the upper stage and the lower stage.

11. The substrate treating apparatus according to claim 7, wherein
the upper stage and the lower stage of the one of the tower units adjacent to the reversing path block include the front face cleaning units across a boundary between the upper stage and the lower stage.

12. The substrate treating apparatus according to claim 8, wherein
the upper stage and the lower stage of the one of the tower units adjacent to the reversing path block include the front face cleaning units across a boundary between the upper stage and the lower stage.

13. The substrate treating apparatus according to claim 3, wherein
the upper stage and the lower stage of the one of the tower units adjacent to the reversing path block includes the back face cleaning units across a boundary between the upper stage and the lower stage.

14. The substrate treating apparatus according to claim 4, wherein
the upper stage and the lower stage of the one of the tower units adjacent to the reversing path block includes the back face cleaning units across a boundary between the upper stage and the lower stage.

15. The substrate treating apparatus according to claim 7, wherein
the upper stage and the lower stage of the one of the tower units adjacent to the reversing path block includes the back face cleaning units across a boundary between the upper stage and the lower stage.

16. The substrate treating apparatus according to claim 8, wherein
the upper stage and the lower stage of the one of the tower units adjacent to the reversing path block includes the back face cleaning units across a boundary between the upper stage and the lower stage.

17. The substrate treating apparatus according to claim 1, wherein
the tower units each include a plurality of treating units in the upper stage thereof and a plurality of treating units in the lower stage thereof in equal arrangement.

18. The substrate treating apparatus according to claim 2, wherein
the tower units each include a plurality of treating units in the upper stage thereof and a plurality of treating units in the lower stage thereof in equal arrangement.

19. The substrate treating apparatus according to claim 3, wherein
the tower units each include a plurality of treating units in the upper stage thereof and a plurality of treating units in the lower stage thereof in equal arrangement.

20. The substrate treating apparatus according to claim 5, wherein
the tower units each include a plurality of treating units in the upper stage thereof and a plurality of treating units in the lower stage thereof in equal arrangement.

* * * * *